(12) United States Patent
Tsuda

(10) Patent No.: US 8,125,301 B2
(45) Date of Patent: Feb. 28, 2012

(54) TRANSVERSAL TYPE FILTER

(75) Inventor: Tadaaki Tsuda, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 344 days.

(21) Appl. No.: 12/456,747

(22) Filed: Jun. 22, 2009

(65) Prior Publication Data

US 2009/0322449 A1   Dec. 31, 2009

(30) Foreign Application Priority Data

Jun. 25, 2008 (JP) ................................ 2008-166431

(51) Int. Cl.
H03H 9/145 (2006.01)
H03H 9/64 (2006.01)

(52) U.S. Cl. .................................... 333/196; 310/313 C

(58) Field of Classification Search .................. 333/196; 310/313 C
See application file for complete search history.

(56) References Cited

U.S. PATENT DOCUMENTS

| | | | | |
|---|---|---|---|---|
| 4,321,567 A | * | 3/1982 | Sandy | 333/196 |
| 4,365,220 A | | 12/1982 | Hikita | |
| 4,458,221 A | * | 7/1984 | Suzuki | 333/196 |
| 4,504,759 A | * | 3/1985 | Schofield | 310/313 C |
| 5,477,098 A | | 12/1995 | Eguchi et al. | |
| 6,023,122 A | * | 2/2000 | Liu et al. | 310/313 B |
| 6,229,409 B1 | | 5/2001 | Tsubouchi et al. | |
| 7,034,634 B2 | | 4/2006 | Nakamura et al. | |
| 7,154,360 B2 | * | 12/2006 | Wada et al. | 333/194 |
| 7,221,074 B2 | * | 5/2007 | Orito et al. | 310/313 C |

FOREIGN PATENT DOCUMENTS

| | | | |
|---|---|---|---|
| JP | 53-17133 | | 2/1978 |
| JP | 56-132807 | | 10/1981 |
| JP | 3-163904 | | 7/1991 |
| JP | 5-029874 | | 2/1993 |
| JP | 5-048373 | | 2/1993 |
| JP | 5-183371 | | 7/1993 |
| JP | 5-218787 | * | 8/1993 |
| JP | 7-050548 | | 2/1995 |
| JP | 10-303692 | | 11/1998 |
| JP | 2001-285014 | | 10/2001 |
| JP | 2003-198318 | * | 7/2003 |
| JP | 2004-320714 | | 11/2004 |

* cited by examiner

Primary Examiner — Barbara Summons
(74) Attorney, Agent, or Firm — Jordan and Hamburg LLP

(57) ABSTRACT

To provide a transversal type filter having weighted finger electrodes of at least either of an input IDT and an output IDT provided on a piezoelectric substrate, in which a diffraction of elastic wave output from an end face of the weighted IDT electrode is suppressed, a band width is wide, and a high flatness and a high selectivity are realized. In at least either of an input IDT and an output IDT, an apodized region in which a weighting is performed by using an apodizing method with which an aperture of finger electrodes is continuously changed is formed on a center portion of the electrode with respect to a propagation direction of an elastic wave, and dog-leg regions in which a weighting is performed by using a dog-leg method with which the aperture is made into 1/n by floating electrodes to form n tracks are formed on both sides of the apodized region. Subsequently, finger electrodes in each track of the dog-leg region are further weighted by using the apodizing method.

7 Claims, 20 Drawing Sheets

Fig. 7
(a)
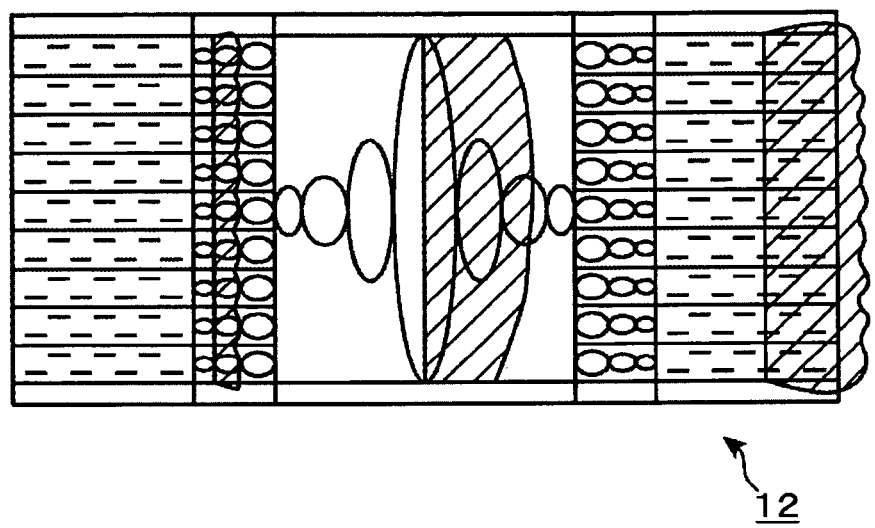
12
(b)
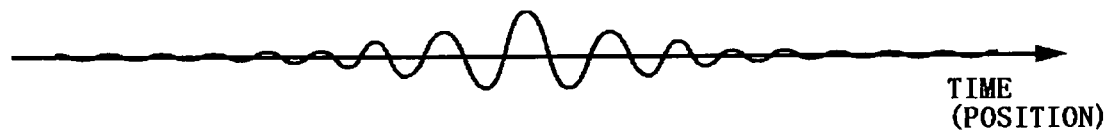
TIME
(POSITION)

Fig. 8
(a)
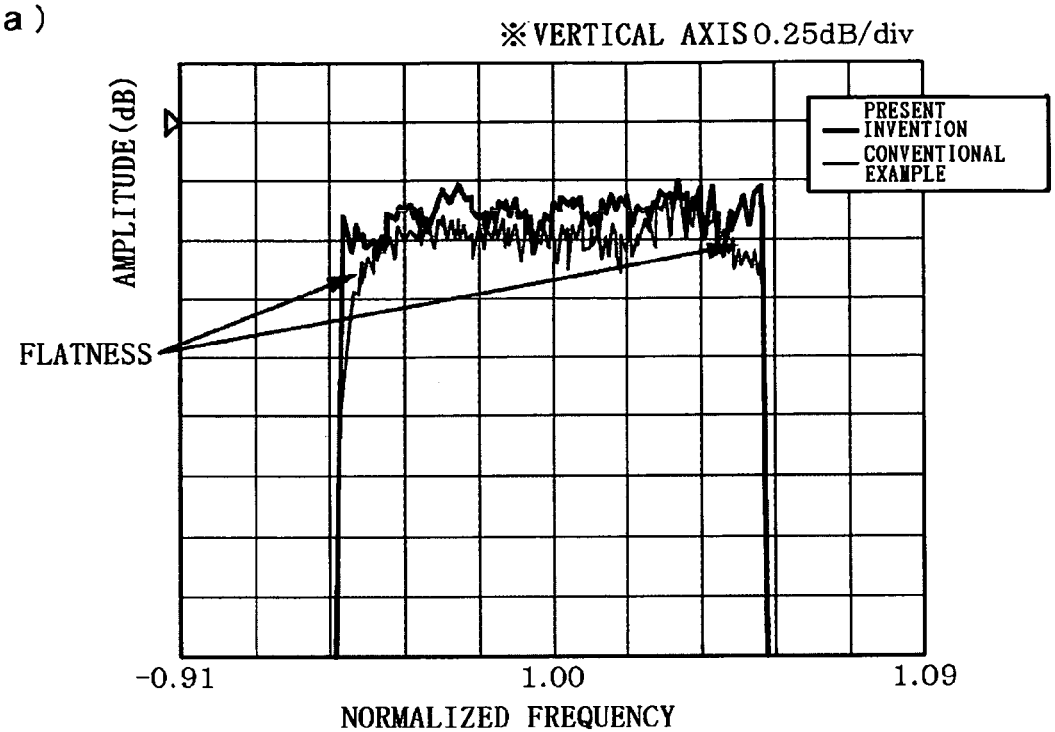
(b)
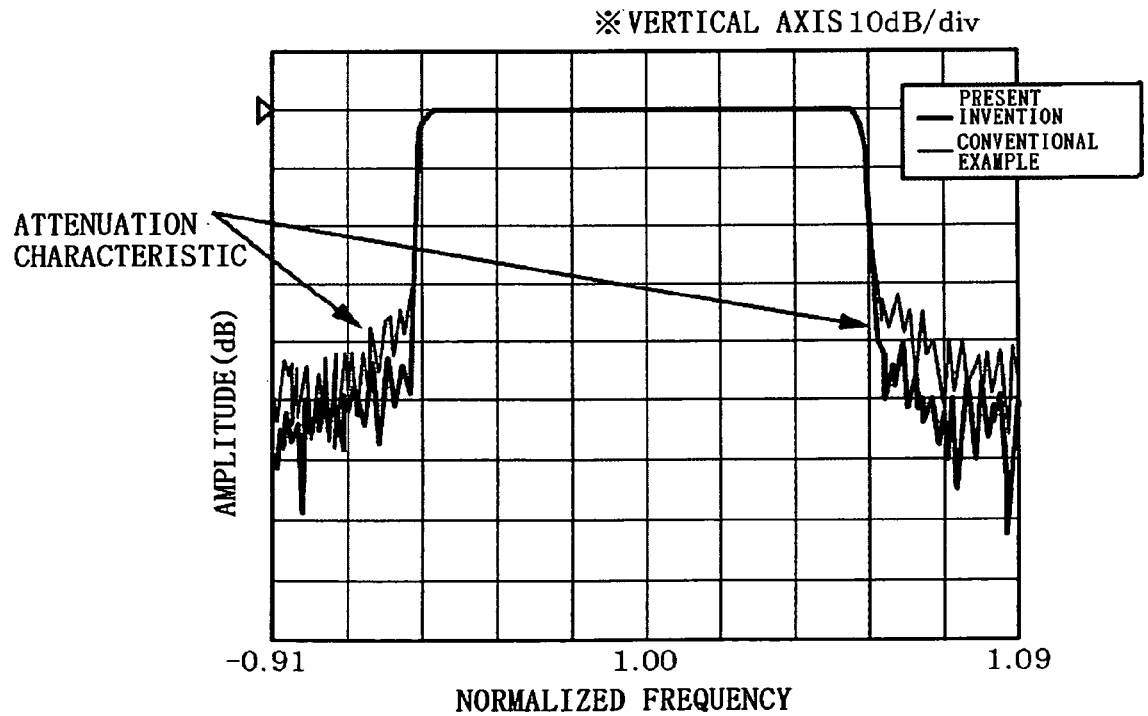

Fig. 9

| ITEM | UNIT | REQUIRED STANDARD | PRESENT INVENTION |
|---|---|---|---|
| INSERTION LOSS (@F0) | dB | 35Max. | 31.0 |
| DEVIATION IN BAND (WITHIN F0±2.8MHz) | dB | 0.5Max. | 0.25 |
| GUARANTEED ATTENUATION AMOUNT (F0±15MHz~F0±3.2MHz) | dB | 35Min. | 37.5 |
| SHAPE FACTOR (35dB BAND WIDTH /0.5dB BAND WIDTH) | — | 1.120 | 1.108 |

※F0:CENTER FREQUENCY

Fig. 13
(a)
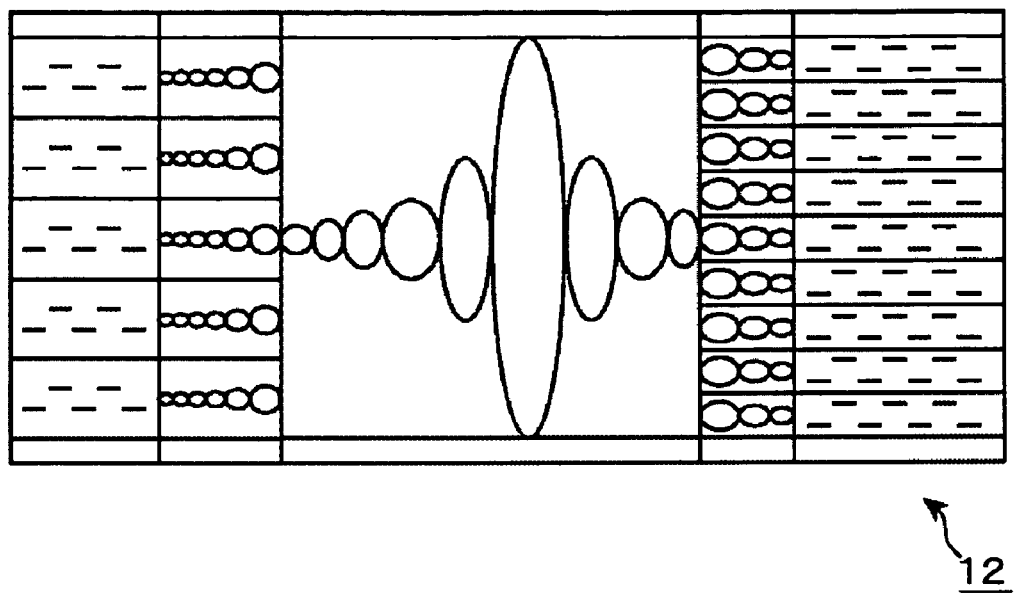
(b)
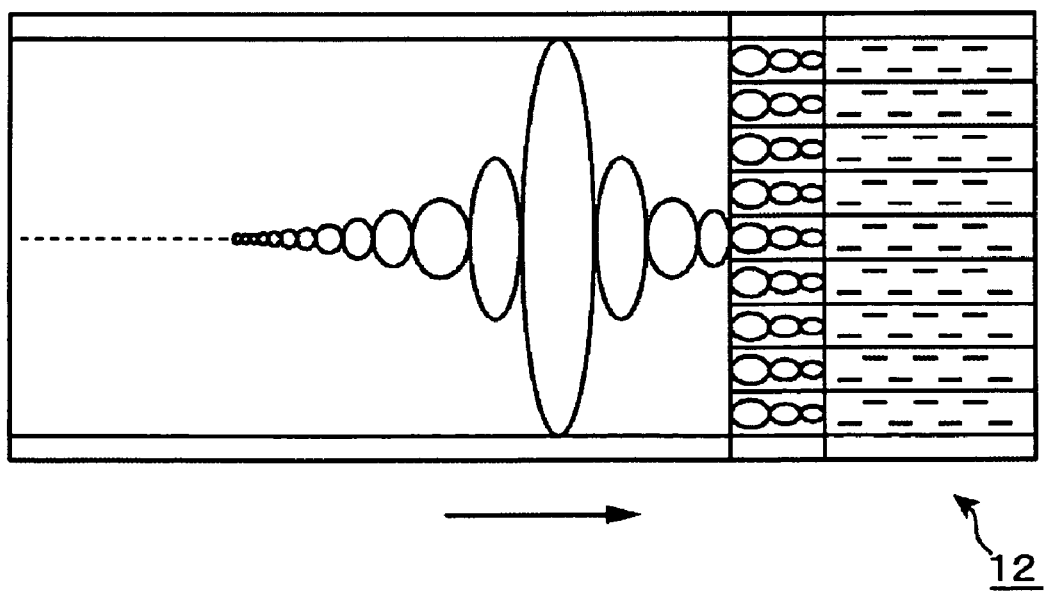

Fig. 15

| ITEM | UNIT | REQUIRED STANDARD | |
|---|---|---|---|
| | | TERRESTRIAL DIGITAL | ANOTHER COMMUNICATION |
| INSERTION LOSS (@FO) | dB | 35Max. | 35Max. |
| DEVIATION IN BAND (FLATNESS) (WITHIN FO±2.8MHz) | dB | 0.5Max. | 1.0Max. |
| GUARANTEED ATTENUATION AMOUNT (FO±15MHz~FO±3.2MHz) | dB | 35Min. | 35Min. |
| SHAPE FACTOR(SELECTIVITY) (35dB BAND WIDTH /0.5dB BAND WIDTH) | — | 1.120 | 2.000 |

※FO: CENTER FREQUENCY

Fig. 16 (a) (b)

Fig. 17
(a)
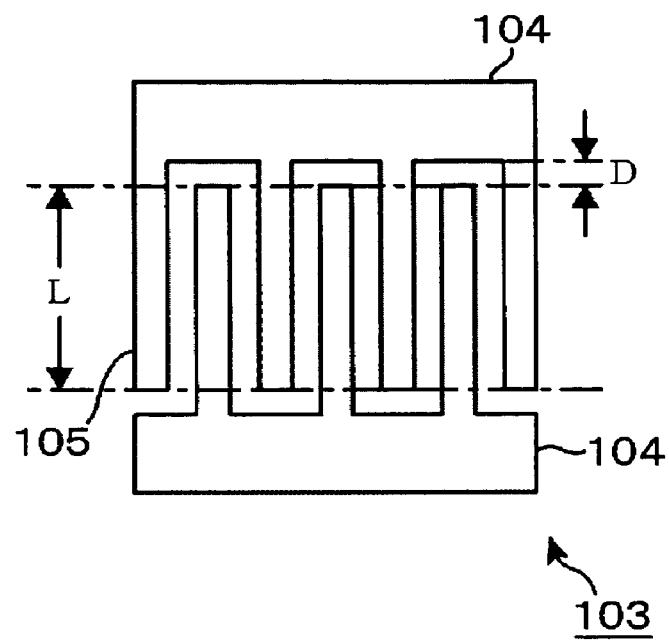
(b)
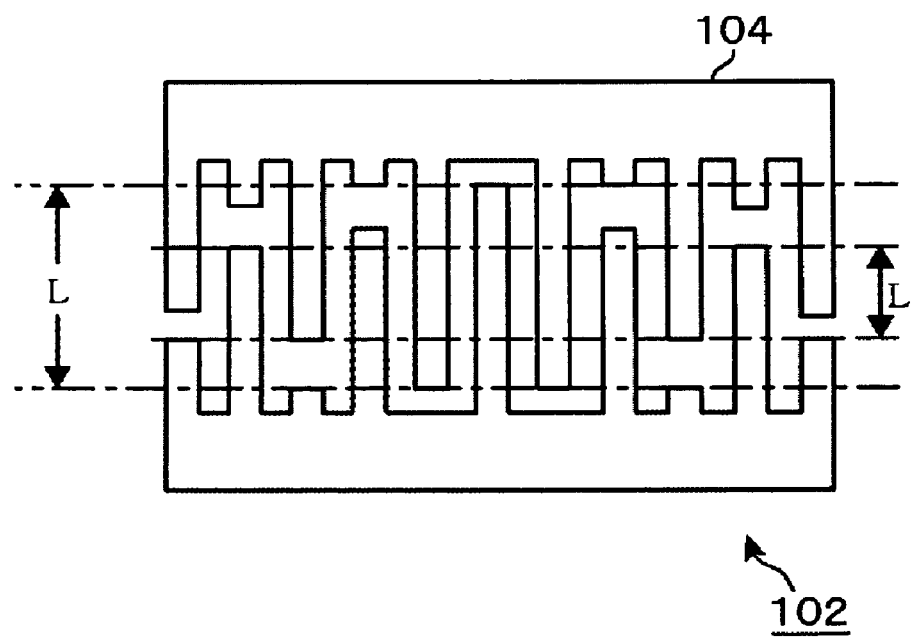

Fig. 20
(a)
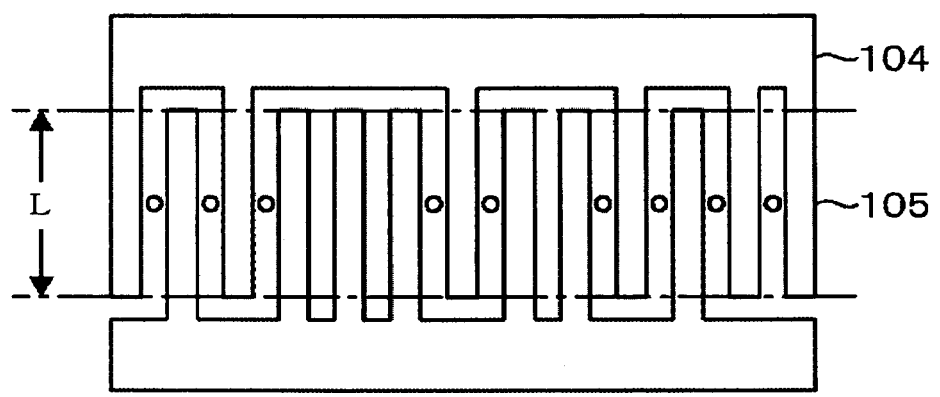
○ : GENERATION POSITION OF ELASTIC WAVE
(b)
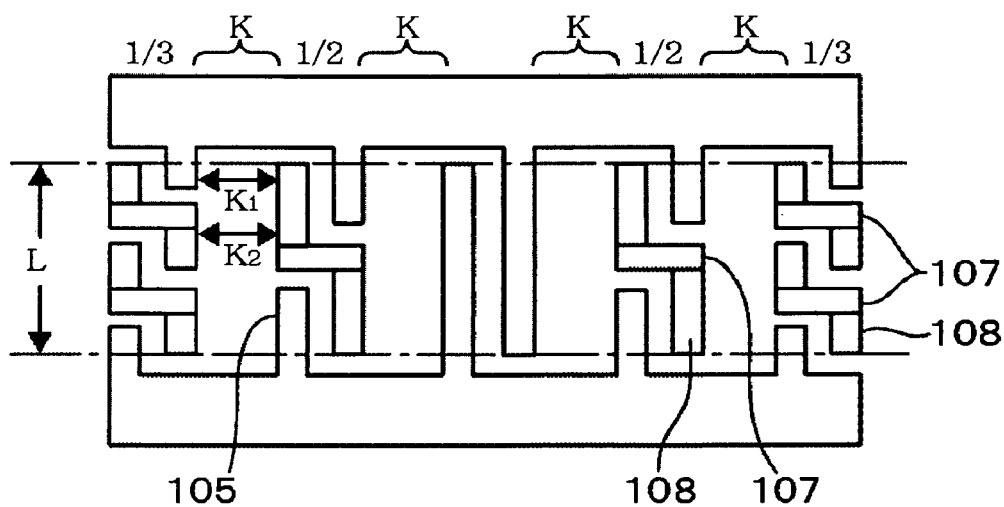

Fig. 22

| ELECTRODE TYPE | OUTLINE, CHARACTERISTIC | EXPRESSION | DIFFRACTION RESISTANCE |
|---|---|---|---|
| NORMAL TYPE | OPENING LENGTH IS ALWAYS MAXIMUM, UNIMODAL FILTER CHARACTERISTIC | △ | ◎ |
| APODIZED TYPE | OPENING LENGTH IS CHANGED, ACCURATE CONTROL OF EXCITATION INTENSITY IS AVAILABLE | ◎ | × |
| WITHDRAWN TYPE | OPENING LENGTH IS UNIFORM, POSITION TO BE EXICITED IS SELECTED | ○ | ◎ |
| DOG-LEG TYPE | OPENING LENGTH IS ALMOST UNIFORM, OPENING LENGTH IS DIVIDED INTO n TO MAKE EXCITATION | ○ | ○ |

TRANSVERSAL TYPE FILTER

BACKGROUND OF THE INVENTION

1. Field of the Invention

The present invention relates to a transversal type filter utilizing an elastic wave such as a SAW (Surface Acoustic Wave).

2. Description of the Related Art

A SAW device utilizes surface acoustic waves, and by arranging electrodes called an IDT (inter-digital transducer) on a piezoelectric substrate to perform an electromechanical interconversion between an electrical signal and an elastic wave, it provides frequency selection (band filter) characteristics. A SAW filter, which is one of such SAW devices, is used as a band-pass filter for various communication devices such as, for instance, a television broadcast transmitting station. In recent years, according to the decision of a shift from analog broadcasting to digital broadcasting in the year 2011, the band-pass filter for the digital broadcast transmitting station has been required to have a wide frequency pass band, as its characteristic. Further, this filter is required to have a high flatness of a signal level and a high selectivity (steep attenuation gradient) in the frequency pass band compared to a standard of another point-to-point communication band-pass filter, as shown in FIG. 15. Accordingly, a transversal type filter is generally used as the filter, since it can independently design an amplitude and a phase of a frequency characteristic.

A filter 100 is provided with an input (transmitting side) IDT 102 and an output (receiving side) IDT 103 formed on a piezoelectric substrate 101, as shown in FIG. 16(a), for instance. The input IDT 102 and the output IDT 103 are formed so as to face each other in a traveling direction of an elastic wave, and each includes a pair of bus bars 104, 104 formed so as to be parallel to a propagation direction of the elastic wave, and a large number of finger electrodes 105 alternately extending from the bus bars 104, 104 in a comb-teeth shape in a direction orthogonal to the propagation direction of the elastic wave. Note that dampers 106, 106 formed on an outside of the input IDT 102 and the output IDT 103 (both ends of the piezoelectric substrate 101 in the longitudinal direction thereof) serve to absorb unnecessary elastic waves propagated from the input IDT 102 and the output IDT 103. Further, a not-shown shield electrode to suppress coupling between the input IDT 102 and the output IDT 103 is formed between the input IDT 102 and the output IDT 103.

Either of the input IDT 102 and the output IDT 103, which is, for instance, the output IDT 103 is formed as a normal type electrode in which an aperture L being a aperture between the alternately extending finger electrodes 105, 105 is formed to be as long as possible, namely, a gap D between a tip of the finger electrode 105 and the bus bar 104 is formed to be as small as possible, and the aperture L is formed to take a constant value in the respective finger electrodes 105, as shown in FIG. 17(a) in a schematic manner.

Meanwhile, the other of the input IDT 102 and the output IDT 103, which is, for instance, the input IDT 102 is formed as an apodized type electrode in which the aperture L is formed to be continuously changed in the propagation direction of the elastic wave, as shown in FIG. 17(b) in a schematic manner. Concretely, as shown in the aforementioned FIG. 16(a), the finger electrodes 105 in the input IDT 102 are formed so that they have a width A in which the aperture L takes the maximum value, at a center portion in the propagation direction of the elastic wave, and the apertures L of both sides of the width A become gradually small until they reach, for instance, almost zero. Accordingly, it can be said that in the region, a figure of schematically oval shape is drawn by a large number of gaps D. If the region of schematically oval shape is called as a main lobe M, regions in which the finger electrodes 105 are formed to have a maximum aperture L whose size is smaller than the width A and is, for instance, a width B (referred to as side lobes S1) are disposed on both sides of the main lobe M. On an outside of the side lobes S1, S1 (end portion sides of the electrode 102), side lobes S2, S2 each having the maximum aperture L smaller than the width B are formed in the same manner, and although an illustration is omitted, on an outside of the side lobes S2, S2, side lobes S3, S4, . . . , Sn in which their maximum apertures L become gradually smaller than the maximum aperture L of the side lobe S2, are disposed. Note that the gaps D are sequentially and alternately formed from upper and lower parts in the respective lobes in the propagation direction of the elastic wave, in which on a boundary between the respective lobes, two gaps D are continuously disposed on either of upper and lower parts in the lobe to reverse the order of the gaps D, to thereby invert a phase of the elastic wave generated between the adjacent lobes.

In the filter 100, when an electrical signal is input into the input IDT 102, an electric field is formed each between the finger electrodes 105, 105 which cross in the input IDT 102 and the piezoelectric substrate 101 is distorted, resulting that the elastic wave, for instance, a SAW (Surface Acoustic Wave) is generated. The electric field is formed by a tap being a crossing region between the finger electrodes 105, 105, so that in the input IDT 102, a large number of elastic waves each having an intensity in accordance with the respective apertures L are generated. These elastic waves are propagated toward, for instance, the output IDT 103, in which a distance between the position of the tap in which the elastic wave is generated and the output IDT 103, for instance, a left end of the output IDT 103 differs depending on each of the elastic waves. Accordingly, the elastic wave generated at a right end of the input IDT 102 first reaches the output IDT 103, and thereafter, the elastic waves generated at the left side of the right end sequentially reach the output IDT 103.

Subsequently, these elastic waves are converted into electrical signals in the output IDT 103, and accordingly, a signal (time response) whose intensity is continuously changed in accordance with the elapse of time is obtained. Therefore, the time response is represented by a waveform having an amplitude intensity corresponding to the aperture L from the left end of the input IDT 102 to the right end thereof, as shown on the right side of FIG. 16(b). As above, in the input IDT 102, the finger electrodes 105 are weighted by changing the respective apertures L, to thereby obtain the time response having a desired amplitude intensity. Note that in the output IDT 103, a part of the elastic waves propagated from the input IDT 102 is received to be converted into the electrical signal, and the remaining elastic waves are reflected by the output IDT 103 to return to the input IDT 102. Subsequently, the elastic waves returned to the input IDT 102 are reflected by the input IDT 102 to propagate to the output IDT 103 again, a part of the propagated elastic waves is received by the output IDT 103 to be converted into the electrical signal, and the remaining elastic waves are reflected toward the input IDT 102. As above, the elastic waves are repeatedly reflected between the input IDT 102 and the output IDT 103 until all energies thereof are converted into the electrical signals in the output IDT 103 or until they are propagated to the end portion sides of the piezoelectric substrate 101 via the input IDT 102 and the output IDT 103 and absorbed by the dampers 106.

Subsequently, by performing a Fourier transform on the time response, a frequency response in which a specific frequency region is extracted is obtained, as shown on the left side of FIG. 16(b). At this time, an amplitude intensity of frequency extracted at the output IDT 103 (insertion loss of the filter 100) is changed depending on a weighting value of each lobe in the input IDT 102. Meanwhile, as the weighting value becomes smaller than a predetermined threshold value, namely, as the elastic wave positions further toward, for instance, the end portion side of the input IDT 102, the influence of the elastic wave excited in the region on the flatness ("C" in FIG. 16(b)) and the attenuation characteristic ("D" in FIG. 16(b)) in the band becomes greater than that on the amplitude intensity of frequency.

In order to widen the frequency pass band as described above in such a filter 100, a method of increasing the number of side lobes S (the number of taps), for instance, is generally applied. However, since the maximum aperture L becomes gradually small from the main lobe M toward the side lobe Sn as described above, if the number of side lobes S is increased, the apertures L at the both end portions of the input IDT 102 become quite small. Therefore, as shown in FIGS. 18(a) and 18(b), when the elastic wave is output from, for instance, the right end of the input IDT 102, it is largely expanded in the direction orthogonal to the propagation direction of the elastic wave due to a diffraction. Further, the elastic wave generated at, for instance, the left end of the input IDT 102 is also largely expanded in the direction orthogonal to the propagation direction of the elastic wave similarly due to the diffraction, when it propagates through the input IDT 102 toward the right side. Further, if the elastic wave is propagated to, for example, a region deviated in the longitudinal direction from the region between the bus bars 104, 104 of the output IDT 103 due to the diffraction, the elastic wave that is not received is generated, which results in loss of energy. As a result, as shown by a dotted line in FIG. 19, the flatness and the attenuation characteristic are deteriorated compared to a case in which no diffraction is generated (solid line). Note that a propagation distance of the elastic wave to the output IDT 103 becomes greater as the elastic wave positions further toward the left side of the input IDT 102 as described above, so that a diffraction loss at the left end of the input IDT 102 becomes greater than that at the right end of the input IDT 102.

Meanwhile, as a method of performing the weighting on the finger electrodes 105, a withdrawal method in which a plurality of finger electrodes 105 are continuously formed from, for instance, one of the bus bars 104 (bus bar 104 at the lower side, in this example) so that an interval (position) at which the elastic wave is generated is adjusted as shown in, for example, FIG. 20(a), is known other than the aforementioned apodizing method. Apodizing method is one of weighting IDT in which a aperture of finger electrodes is changed in a propagation direction of the elastic wave. Further, there is also known a method such as a dog-leg method in which floating electrodes 107 extending in parallel with the bus bars 104 are disposed at positions in which the aperture L becomes 1/n (n: positive number) to divide a propagation region being a region between the bus bars 104, 104 into tracks being n propagation paths, finger electrodes 108 extending in a direction orthogonal to the bus bars 104 are formed on the floating electrodes 107, and the finger electrodes 105 (108) are alternately disposed in each track, to thereby make an amplitude of the generated elastic wave into 1/n, as shown in FIG. 20(b). With the use of these methods, it is possible to obtain a long aperture L compared to a case in which the aforementioned apodizing method is used, so that even when the weighting is performed so as to reduce the amplitude of the elastic wave, it is possible to suppress the diffraction of the elastic wave.

However, since the withdrawal method performs the weighting depending on the presence/absence of the finger electrodes 105, the weighting cannot be conducted continuously as in the apodizing method and the weighting amount becomes discrete, so that it lacks an expression of characteristic. Accordingly, the application of only this method is not suitable for realizing the widening of the frequency pass band, the improvement of flatness of the signal level or the improvement of attenuation characteristic (enhancement of the selectivity) in the frequency pass band. Further, the dog-leg method performs the weighting according to the number of divisions of the propagation region (the number of tracks), so that also in this method, the weighting amount becomes discrete. In addition, the floating electrode 107 is not connected to the outside (input port, output port or ground), so that even if the aperture between the finger electrodes 105 (108) is the same, there is generated a difference, although very little, between an electric field (k1) excited between the finger electrode 105 and the finger electrode 108 and an electric field (k2) excited between the finger electrode 108 and the finger electrode 108. Therefore, in order to suppress a mutual interference between the elastic waves generated in these electric fields, it is preferable to provide a gap K in which, for instance, the finger electrodes 105 (108) are not formed and a weighting value is forcibly set to zero between regions having a different number of divisions. Accordingly, if a large number of divided regions are formed, namely, if regions having different weighting amounts are increased, the gaps K are increased, resulting that unnecessary undulation is generated in the band, as shown in FIG. 21.

The weighting methods described above have advantages and disadvantages as shown in FIG. 22, and each method is inadequate to satisfy the aforementioned standard. Further, there is known a method of performing the weighting on the finger electrodes 105 of both the input IDT 102 and the output IDT 103 using either of the above-described methods, or a method of suppressing the diffraction loss by weighting a region close to the main lobe M of either of the IDT 102 (103) using the apodizing method and weighting a region in proximity to the side lobe Sn, namely, an end portion of the electrode 102 (103) using the withdrawal method, but, either of the methods is inadequate to satisfy the aforementioned standard. Patent Documents 1 to 6 disclose the weighting method such as the dog-leg method, but, no studies have been done regarding the above-described problems.

[Patent Document 1] Japanese Patent Application Laid-open No. 2004-320714

[Patent Document 2] Japanese Patent Application Laid-open No. Sho 56-132807

[Patent Document 3] Japanese Patent Application Laid-open No. Hei 5-29874

[Patent Document 4] Japanese Patent Application Laid-open No. Hei 5-183371

[Patent Document 5] Japanese Patent Application Laid-open No. Hei 7-50548

[Patent Document 6] Japanese Patent Application Laid-open No. Hei 10-303692

SUMMARY OF THE INVENTION

The present invention is made based on such circumstances, and an object thereof is to provide a transversal type filter having weighted finger electrodes of at least either of an input IDT and an output IDT provided on a piezoelectric substrate, in which a diffraction of elastic wave output from the weighted IDT electrode is suppressed, a frequency pass band is wide, a flatness of a signal level in the frequency pass band is high, and a selectivity in the frequency pass band is high (attenuation gradient is steep).

A transversal type filter according to the present invention comprising: an input IDT provided with a large number of finger electrodes; an output IDT provided with a large number of finger electrodes to receive an elastic wave propagated from the input IDT; the finger electrodes of at least either of the input IDT and the output IDT are weighted so that a magnitude of amplitude of the elastic wave excited or received between the finger electrodes is changed between the respective finger electrodes; an apodized region provided in at least either of the input IDT and the output IDT and in which a weighting is performed on a aperture of the finger electrodes using an apodizing method; and a dog-leg region provided in at least either of the input IDT and the output IDT, formed on at least either of regions adjacent to the apodized region in a propagation direction of the elastic wave, and formed by dividing a propagation region of the elastic wave into a plurality of propagation paths in parallel with the propagation direction of the elastic wave using a dog-leg method, in which an apodized composite region in which the aperture of the finger electrodes is weighted by the apodizing method is formed on each of the plurality of propagation paths, and the apodized region includes at least two finger electrodes whose aperture is adjusted so that a weighting amount of the finger electrodes takes a maximum value in at least either of the input IDT and the output IDT on which the weighting is performed by the apodizing method.

It is preferable that the apodized region is formed on a central region of at least either of the input IDT and the output IDT in the propagation direction of the elastic wave, and the dog-leg region is connected to at least either of an input side and an output side of the elastic wave in the apodized region.

The apodized region includes a main lobe formed on a central region thereof in the propagation direction of the elastic wave and in which the weighting amount of the finger electrodes is gently decreased from a center toward both sides thereof, and a side lobe formed on either of regions on both sides of the main lobe and in which the weighting amount of the finger electrodes is gently decreased from a center toward both sides thereof, in which the weighting amount of the finger electrodes in the center of the side lobe is preferably set to be smaller than the weighting amount of the finger electrodes in the center of the main lobe.

A withdrawn region in which a crossing position of the finger electrodes is withdrawn using the withdrawal method may be connected, or a withdrawn composite region in which a propagation region of the elastic wave is divided into a plurality of propagation paths in parallel with the propagation direction of the elastic wave using the dog-leg method and a crossing position of the finger electrodes is withdrawn in each of the propagation paths using the withdrawal method, may be connected to a region in the dog-leg region on the opposite side of the apodized region.

It is preferable that a region in which the weighting amount of the finger electrodes is zero is interposed on a boundary between the apodized region and the dog-leg region and between regions in the dog-leg region and the withdrawn composite region in which the number of propagation paths divided by the dog-leg method is different.

Preferably, a shield electrode for suppressing coupling between the input IDT and the output IDT is provided between the input IDT and the output IDT.

According to the transversal type filter of the present invention, in at least either of the input IDT and the output IDT formed on the piezoelectric substrate, the apodized region in which the weighting is performed on the aperture of the finger electrodes using the apodizing method is formed on the region in which the weighting amount of the finger electrodes takes the maximum value in the electrode, and in at least either of the regions adjacent to the apodized region in the propagation direction of the elastic wave, the apodized composite region is formed by dividing the propagation region of the elastic wave into the plurality of propagation paths in parallel with the propagation direction of the elastic wave using the dog-leg method, in which in each of the propagation paths, the weighting is performed on the aperture of the finger electrodes using the apodizing method. Accordingly, the weighting of the finger electrodes can be finely and continuously performed in the apodized region, and it is possible to obtain a large aperture between each of the finger electrodes in the apodized composite region compared to a case in which the finger electrodes are weighted using only the apodizing method, so that it is possible to suppress the diffraction of the elastic wave output from the apodized composite region while finely and continuously performing the weighting on the finger electrodes. Therefore, as a whole filter, it is possible to accurately design the filter so that an output signal has an intended intensity, and further, it is possible to suppress energies of the elastic waves lost by the diffraction to a low level, resulting that the flatness of the signal level in the frequency pass band can be increased, and further, the selectivity of signal (attenuation characteristic) can be enhanced.

In addition, on the region in the apodized composite region on the opposite side of the apodized region, the withdrawn region in which the crossing position of the finger electrodes is withdrawn by the withdrawal method is formed, so that it is possible to obtain the long aperture of the finger electrodes, and the diffraction of the elastic wave can be suppressed. Further, it is possible to reduce the weighting amount while obtaining the long aperture between each of the finger electrodes by increasing the number of divisions of the propagation paths in the aforementioned apodized composite region and by withdrawing the crossing position of the finger electrodes in the withdrawn region, for example, so that by increasing the number of finger electrodes, it is possible to form a large number of crossing regions between the finger electrodes in which the elastic wave is excited or received. Therefore, it is possible not only to suppress the diffraction of the elastic wave but also to widen the frequency pass band of the filter.

BRIEF DESCRIPTION OF THE DRAWINGS

FIGS. 7(a) and 7(b) are schematic views showing a state in which an elastic wave propagates in the aforementioned filter;

FIGS. 8(a) and 8(b) are characteristic diagrams showing an example of a frequency characteristic obtained in the aforementioned filter;

FIG. 9 is a characteristic diagram showing an example of a frequency characteristic obtained in the aforementioned filter;

FIGS. 13(a) and 13(b) are plan views showing another configuration example of the aforementioned filter;

FIG. 15 is a characteristic diagram showing an example of a standard required to a band-pass filter for a digital broadcast transmitting station;

FIGS. 17(a) and 17(b) are schematic views showing a configuration example of finger electrodes in the transversal type filter;

FIGS. 20(a) and 20(b) are schematic views showing a configuration example of the finger electrodes in the transversal type filter;

FIG. 22 is a schematic view showing an outline of characteristic obtained in electrodes to which different weighting methods of finger electrodes are applied.

DETAILED DESCRIPTION OF THE PREFERRED EMBODIMENT(S)

A transversal type filter being an embodiment of the present invention will be described with reference to FIG. 1 to FIG. 6. The transversal type filter is provided with an input (transmitting side) IDT 12 and an output (receiving side) IDT 13 formed on a surface of a piezoelectric substrate 11 by being separated from each other in a longitudinal direction of the piezoelectric substrate 11. Between these input IDT 12 and output IDT 13, a shield electrode 17 for suppressing coupling between the input IDT 12 and the output IDT 13 is formed. The shield electrode 17 is formed as, for instance, a film over which a metal is formed, a grating electrode provided with a large number of finger electrodes extending in a direction orthogonal to a propagation direction of an elastic wave and a pair of bus bars for connecting both ends of the finger electrodes, or the like. On lateral positions of the input IDT 12 and the output IDT 13 on both end sides of the piezoelectric substrate 11 in the longitudinal direction thereof, dampers 16a, 16b for absorbing unnecessary elastic waves propagated to the both ends via the input IDT 12 and the output IDT 13 are respectively disposed.

Figure 1:
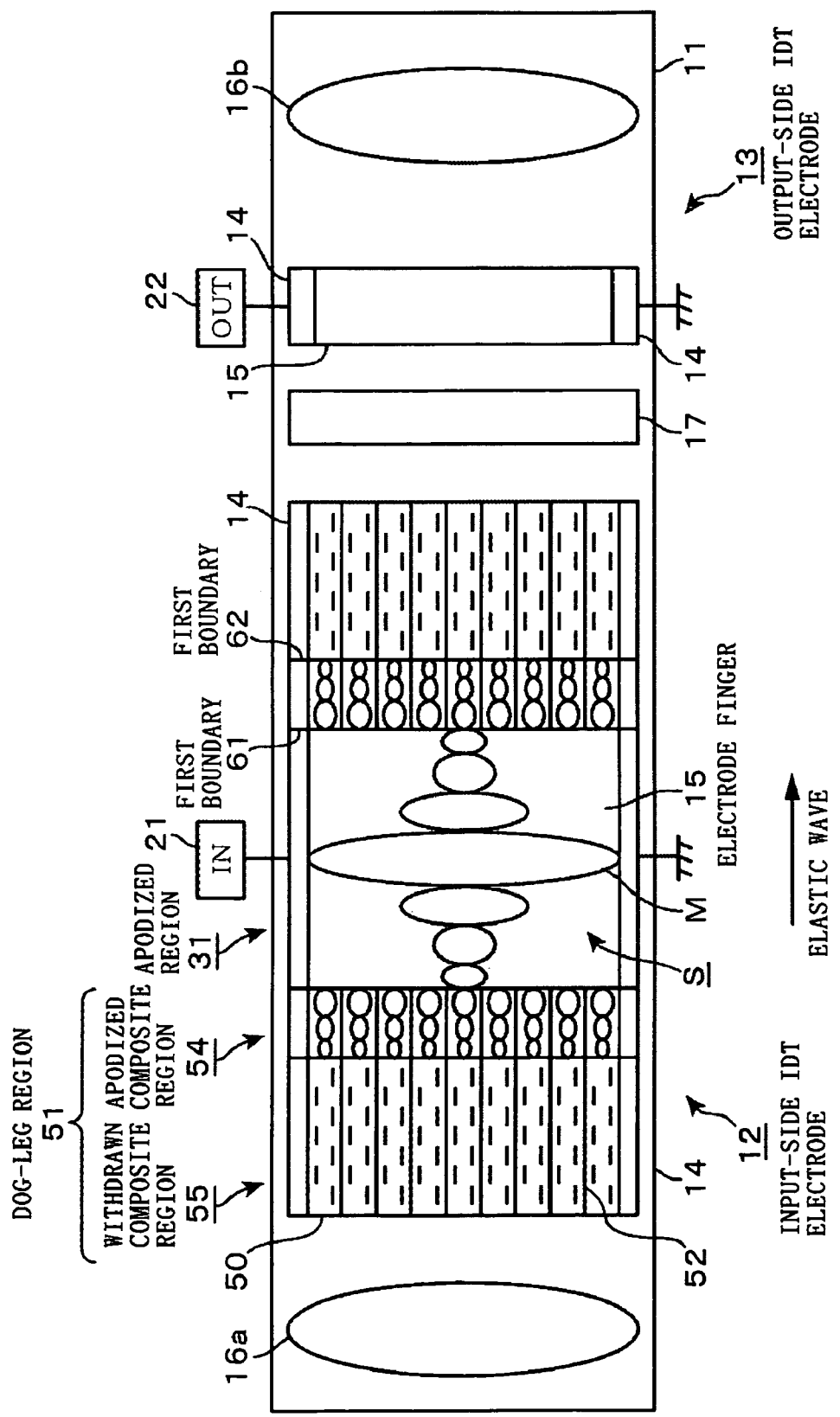
FIG. 1 is a schematic plan view showing an example of a transversal type filter of the present invention.

Each of the input IDT 12 and the output IDT 13 is provided with a pair of bus bars 14, 14 formed so as to be parallel to the propagation direction of the elastic wave and a large number of finger electrodes 15 alternately extending from the bus bars 14, 14 in a comb-teeth shape in a direction orthogonal to the propagation direction of the elastic wave. A region between the pair of bus bars 14, 14 forms a propagation region of the elastic wave. For instance, two of the finger electrodes 15 are paired and the pairs are disposed alternately, although a part of an illustration thereof is omitted in later-described FIG. 2, FIG. 4 and FIG. 6. In the input IDT 12, one of the bus bars 14 is connected to an input port 21, and the other bus bar 14 is grounded. In the output IDT 13, one of the bus bars 14 is connected to an output port 22, and the other bus bar 14 is grounded. Note that the finger electrodes 15 are schematically illustrated in FIG. 1.

Figure 2:
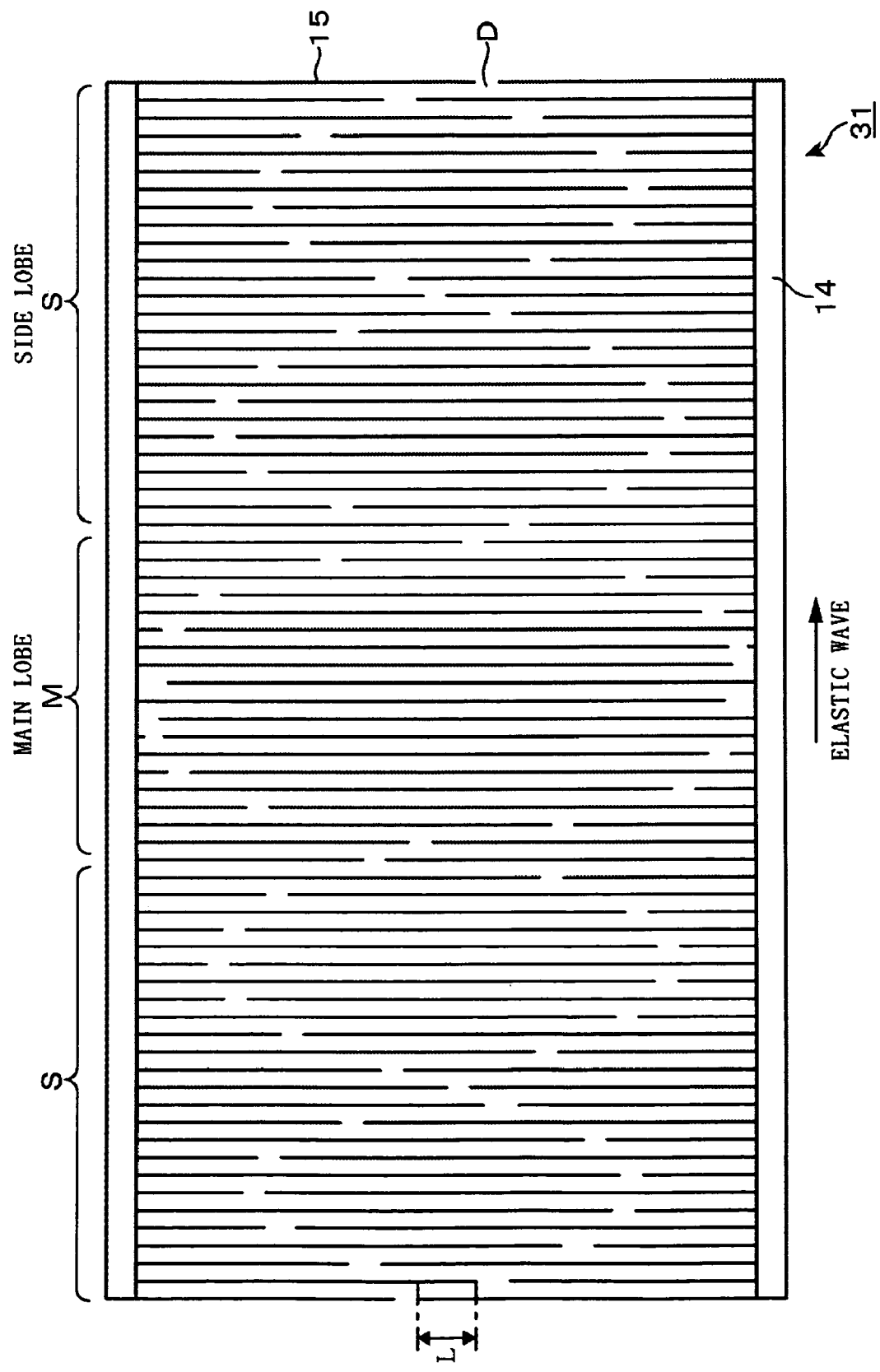
FIG. 2 is a plan view showing an example of an apodized region in an input IDT of the aforementioned filter.
Figure 3:
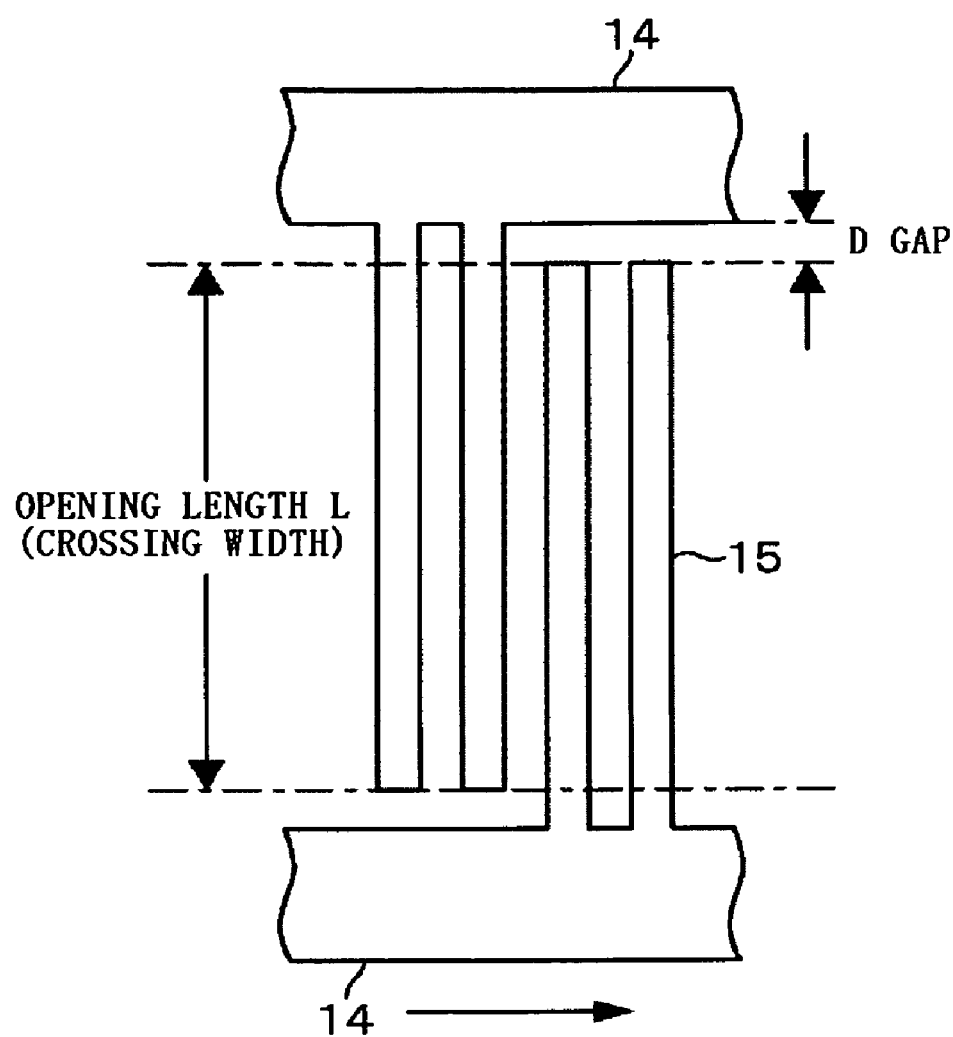
FIG. 3 is a schematic plan view showing an example of an arrangement pattern of finger electrodes in an electrode of the aforementioned filter.

The input IDT 12 is schematically divided into three regions in the direction orthogonal to the propagation direction of the elastic wave, in which an apodized region 31 is formed on a center portion, and dog-leg regions 51, 51 are formed on regions adjacent to both sides of the apodized region 31, so as to sandwich the apodized region 31. As shown in FIG. 3, if a aperture of the finger electrodes 15 is set as an aperture L, the apodized region 31 is formed so that the aperture L is continuously changed in the propagation direction of the elastic wave (in the right direction in FIG. 1), as shown in FIG. 2. Further, the finger electrodes 15, 15 extend so as to oppose to each other from the pair of bus bars 14, 14, and a gap D is formed between each of tip portions of the opposed finger electrodes 15, 15. Further, in order to make the gaps D between the respective finger electrodes 15, 15 have the same opening size, a length of the finger electrode 15 extending from one of the bus bars 14 is adjusted in accordance with a length of the finger electrode 15 extending from the other bus bar 14.

Accordingly, it can be said that in a central region of the input IDT 12, a figure of schematically oval shape is drawn by a large number of gaps D. If the region of schematically oval shape is called as a main lobe M, the finger electrodes 15 are disposed in the main lobe M so that the aperture L at a center position of the apodized region 31 takes the maximum value in the apodized region 31, and the apertures L of both sides of the center position become gradually small until they reach almost zero. A plurality of, for instance, four side lobes S being regions in which the gaps D are similarly disposed in a schematically oval shape are respectively disposed on both sides of the main lobe M, in which the weighting is performed so that the maximum value of the aperture L in each of the side lobes S becomes gradually smaller than the maximum value of the aperture L of the main lobe M, as the side lobes S are distant from the main lobe M.

Note that in order to simplify the drawing, a thickness of the bus bars 14 and the finger electrodes 15, the number of the pair of crossed finger electrodes 15, 15, and the like are illustrated in a schematic form in FIG. 2, but, actually, the bus bars 14 and the finger electrodes 15 have a predetermined width as shown in FIG. 3, FIGS. 17(a) and 17(b), and FIGS. 20(a) and 20(b), and two of the finger electrodes 15, 15 are paired and the pairs are crossed. Further, the number, the position, the aperture L and the like of the side lobes S are also illustrated in a schematic form in FIG. 2. The same applies to the following FIG. 4 and FIG. 6. Further, the gaps D are sequentially and alternately formed from upper and lower parts in the respective lobes in the propagation direction of the elastic wave, in which on a boundary between the respective lobes, two gaps D are continuously disposed on either of upper and lower parts in the lobe to reverse the order of the gaps D, to thereby invert a phase of the elastic wave generated between the adjacent lobes.

The dog-leg regions 51, 51 are disposed on both sides of the apodized region 31, and are formed of apodized composite regions 54, 54 adjacent to the apodized region 31 and withdrawn composite regions 55, 55 formed on an outside of the apodized composite regions 54, 54, as shown in the aforementioned FIG. 1. In this example, each of the apodized composite region 54 and the withdrawn composite region 55 of the dog-leg region 51 is divided into tracks 50 which are a plurality of stages of, for instance, nine stages of propagation paths in a direction parallel to the propagation direction of the elastic wave by floating electrodes 52 formed so as to be parallel to the bus bars 14. Accordingly, the weighting is performed so as to make the maximum amplitude intensity of the elastic wave generated in each of the tracks 50 become ⅑ of the maximum amplitude intensity of the elastic wave generated in the apodized region 31.

Figure 4:
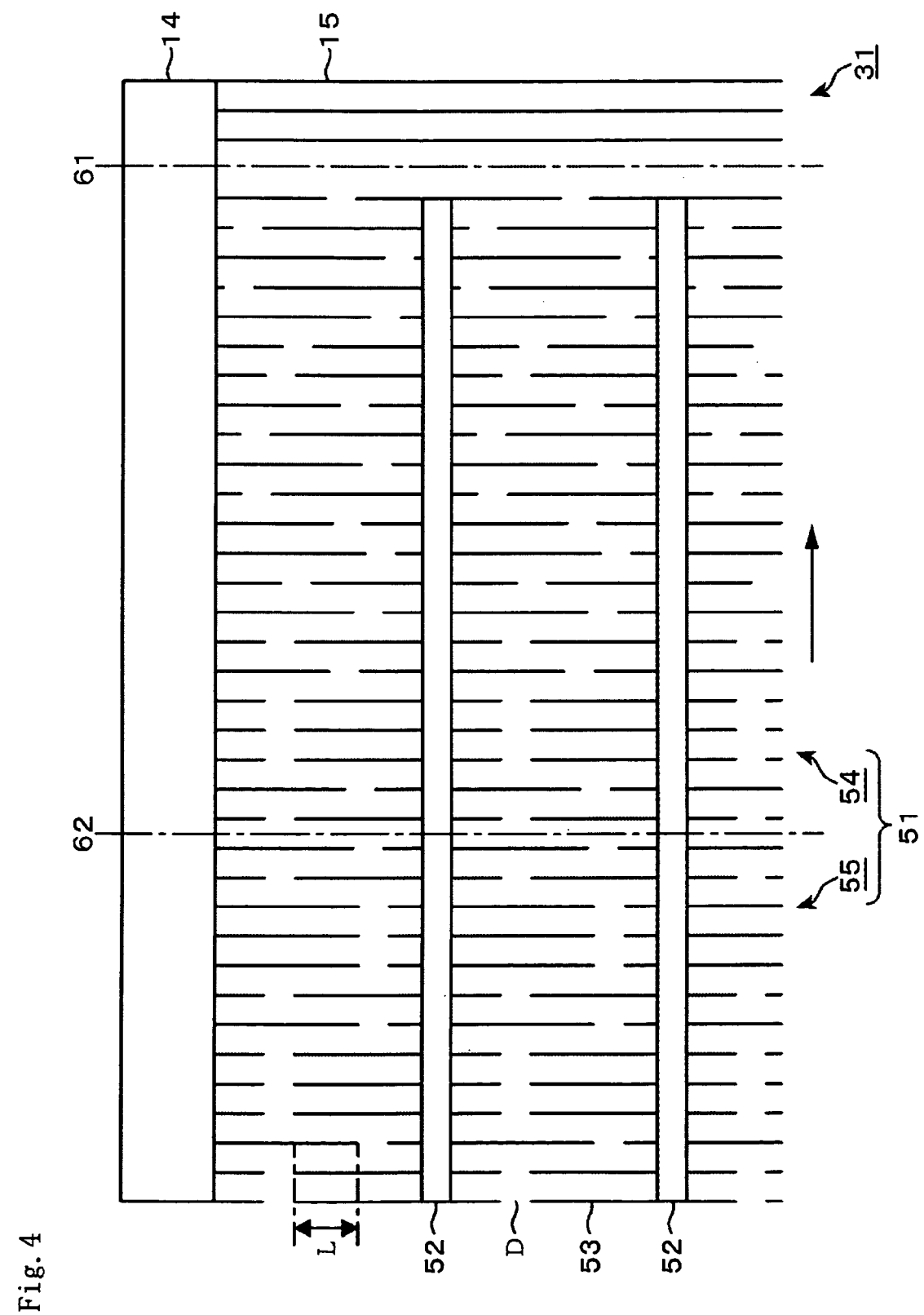
FIG. 4 is a plan view showing, in an enlarged manner, an example of a dog-leg region of the aforementioned filter.

As shown in FIG. 4, a large number of finger electrodes 53 extending in a longitudinal direction orthogonal to the propagation direction of the elastic wave are connected to the floating electrodes 52, and it is configured such that in each of the tracks 50, two of the finger electrodes 15 (52) are paired and the pairs are alternately crossed in a comb-teeth shape between the bus bar 14 and the floating electrode 52 or between the floating electrodes 52, 52. A width of the finger electrode 15 (53) and a distance between the finger electrodes 15 (53) and 15 (53) in the dog-leg region 51 are set to have the same sizes as those in the apodized region 31, and further, the gap D between each of the tip portions of the finger electrodes 15, 53 extending so as to oppose to each other from the bus bar 14 and the floating electrode 52 is also set to have the same size as that in the apodized region 31.

The dog-leg region 51 and the aforementioned apodized region 31 are disposed by being separated from each other at a first boundary 61 by a size of, for example, two of the finger electrodes 15 (one tap), in order to suppress an interference between the elastic wave generated between the adjacent finger electrode 15 of the apodized region 31 and the finger electrode 53 of the dog-leg region 51 and the elastic wave generated between the adjacent finger electrode 15 of the apodized region 31 and the finger electrode 53 of the dog-leg region 51. Specifically, the weighting amount is set to zero in the first boundary 61.

In each of the tracks 50 of the apodized composite region 54 divided by the floating electrodes 52, a plurality of, for instance, four side lobes S are formed, similarly as in the aforementioned apodized region 31. The side lobes S are disposed so that the maximum apertures L in the respective side lobes S become gradually small as they are distant from the apodized region 31. Accordingly, in the apodized composite region 54, the weighting using the dog-leg method is performed by the floating electrodes 52, and the weighting using the apodizing method is also performed. Further, the weighting amount in the apodized composite region 54 is set to be continuously decreased from that in the apodized region 31, which will be described later. Note that FIG. 4 shows, in an enlarged manner, the input IDT 12 in the vicinity of the upper bus bar 14 on the left side of the apodized region 31, each of the tracks 50 divided by the floating electrodes 52 is configured in the same manner, and the right side of the apodized region 31 is configured symmetrical to the left side.

On lateral positions of the apodized composite regions 54, the withdrawn composite regions 55 are disposed via second boundaries 62, and in each of the tracks 50 of the withdrawn composite regions 55 divided by the floating electrodes 52, the weighting is performed using the withdrawal method. Concretely, the withdrawal method is a method of performing the weighting by, for instance, continuously disposing the finger electrodes 15 (53) of the same direction on one of the bus bars 14 or the floating electrode, 52, namely, by reducing the number of positions at which the elastic wave is generated by withdrawing the positions at which the finger electrodes 15 (53), 15 (53) are crossed, and in this example, it is set such that the number of positions at which the elastic wave is generated becomes gradually small as the position goes further toward the end portion of the input IDT 12. Further, the aperture L in the withdrawn composite region 55 is constant in the region 55, and is set to have substantially the same value as that of the aperture L in the apodized composite region 54 adjacent to the withdrawn composite region 55, for instance. Therefore, the aperture L in the withdrawn composite region 55 is set to have a large value compared to a case in which the weighting is performed in the respective tracks 50 using the apodizing method.

Figure 5:
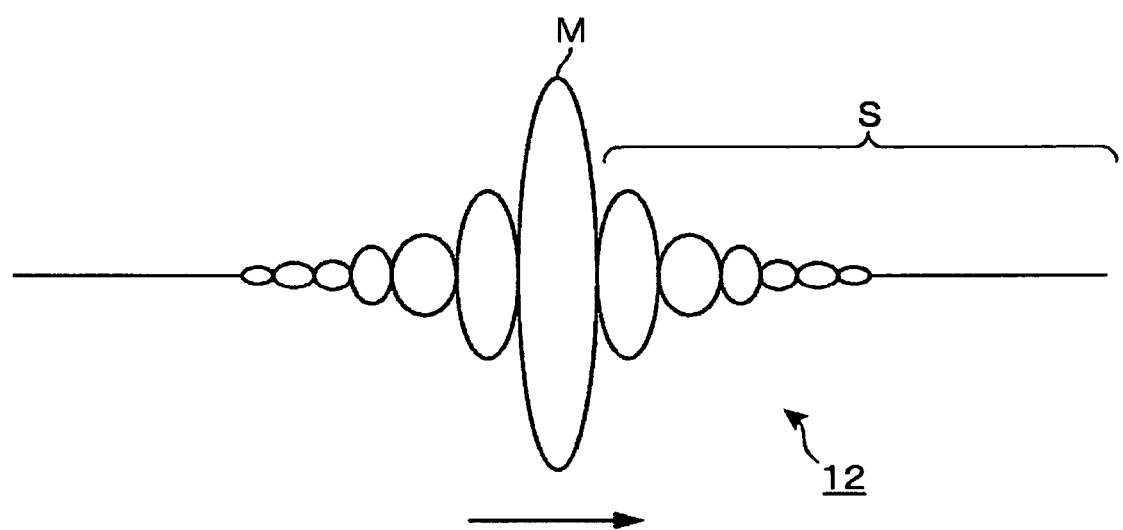
FIG. 5 is a schematic view showing an example of a weighting amount of the finger electrodes in the input IDT of the aforementioned filter.

Further, the weighting amount in the withdrawn composite region 55 is adjusted to be continuously decreased from that in the apodized composite region 54, and accordingly, it can be said that in the input IDT 12, the weighting amount of the finger electrodes 15 takes the maximum value in the electrode 12 at a center of the main lobe M, and the large number of side lobes S are formed so that the weighting amount of the finger electrodes 15 at a center of each lobe becomes gradually small as the lobes are distant from the main lobe M, as shown in FIG. 5. Note that also in the boundaries 61 and 62, and the dog-leg region 51, the disposed positions of the gaps D in the boundaries between the respective lobes are adjusted so that the phase of the generated elastic wave is inverted.

In this example, if the weighting amount at a center of the main lobe M is set to 1, the weighting amount at a center of the side lobe S in the apodized composite region 54 adjacent to the apodized region 31 is set to 0.124, and the weighting amount at a center of the side lobe S in the withdrawn composite region 55 adjacent to the apodized composite region 54 is set to 0.035. Note that the oval shapes in FIG. 5 schematically illustrate the weighting amounts in the respective lobes.

Here, when the plurality of regions to which different weighting methods are applied such as the apodized region 31, the apodized composite regions 54 and the withdrawn composite regions 55 are formed on the input IDT 12 as described above, the size of each of the regions 54 and 55 (distance from the first boundary 61 or the second boundary 62 to the main lobe M), and the weighting amount of each of the regions 54 and 55 are designed as follows. At this time, a designing method of a pattern of a photoresist mask in an example in which a metal film made of, for instance, aluminum or the like is formed over the piezoelectric substrate 11, and a patterned photoresist mask is laminated on the metal film, to thereby form a filter by performing etching on the metal film via the mask, is described.

First, positions of respective lobes and weighting amounts of the respective lobes when the total region of the input IDT 12 is weighted by using the apodizing method with which a fine design can be realized, are examined. Subsequently, to a region having a weighting amount larger than a predetermined threshold value, the weighting using the apodizing method is applied. Further, it is designed such that the apodized composite region 54 is formed from a position of a side lobe S having a weighting amount smaller than the threshold value, and further, the withdrawn composite region 55 is formed from a position of a side lobe S having a weighting amount smaller than another threshold value. At this time, the number of divisions of the tracks 50, the maximum aperture L of each side lobe S in the apodized composite region 54, and the withdrawal amount of the finger electrodes 15, 53 in the withdrawn composite region 55 are set so that the weighting amount in each of the regions 54 and 55 corresponds to the same weighting amount as that initially examined by using the apodizing method.

By performing etching on the metal film via the mask formed by such a designing method, the weighting amounts of the respective lobes in the input IDT 12 are set to become continuously and gradually smaller than the weighting amount of the main lobe M, in substantially the same manner as in the case in which the total region of the input IDT 12 is weighted by using the apodizing method, as shown in the aforementioned FIG. 5. Note that in the apodizing method, for instance, these threshold values are appropriately set in accordance with the weighting amount at which the influence of diffraction becomes large, the weighting amount at which the influence on a characteristic value such as, for instance, the flatness of the signal level and the attenuation characteristic in the frequency pass band becomes large, or the like, namely, the required frequency characteristic. In the above example, the values such as 0.124 and 0.035 are used as such threshold values, as described above.

Figure 6:
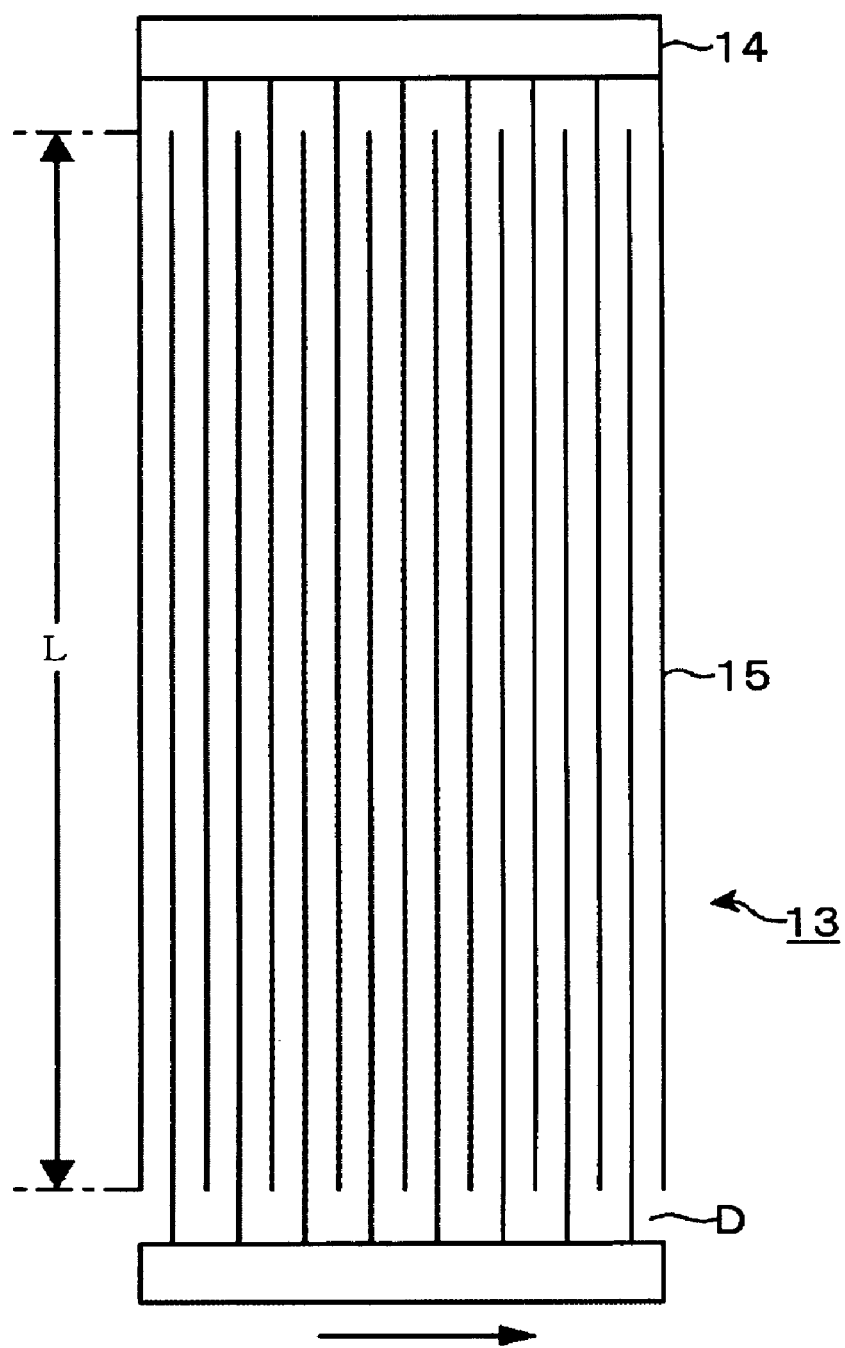
FIG. 6 is a plan view showing an example of an output IDT of the aforementioned filter.

The aforementioned output IDT 13 is a normal type electrode, in which the aperture L is set so that the tip portions of the finger electrodes 15 extending from one of the bus bars 14 and the other bus bar 14 come close to each other, and it is configured such that the aperture L takes a constant value in the respective finger electrodes 15, as shown in FIG. 6. The aperture L in the output IDT 13 takes the same value as that of the maximum aperture L in the aforementioned main lobe M, and therefore, the gap D in the electrode 13 is set to have the same length as that of the gap D in the input IDT 12.

Next, a state in which the electrical signal is converted into the elastic wave, and the elastic wave is received as the electrical signal again in the transversal type filter will be described hereinafter.

First, when the electrical signal is input into the input port 21, the electric field is generated in the tap being the crossing region between the finger electrodes 15 (53) and 15 (53) of the input IDT 12, and the piezoelectric substrate 11 is distorted due to the electric field, resulting that the elastic wave, for instance, the SAW (Surface Acoustic Wave) is generated (excited). The crossing regions between the finger electrodes 15 (53) and 15 (53) are formed at a large number of portions in the input IDT 12 as shown in the aforementioned FIG. 1 to FIG. 4, so that a large number of elastic waves are generated in the propagation direction of the elastic waves as shown in FIG. 7(*a*).

Further, these elastic waves are excited in each of crossing regions, so that in the apodized region 31, the elastic waves are formed so that an excitation intensity thereof is continuously changed in accordance with the apertures L between the respective finger electrodes 15, 15. In the apodized composite region 54, since the region is weighted by using the dog-leg method as described above, the maximum amplitude intensity is ⅕ of the maximum amplitude intensity in the aforementioned apodized region 31, and further, since the inside of each track 50 is weighted by using the apodizing method, the elastic waves are formed so that an amplitude intensity thereof is continuously changed within the ⅕ of the amplitude intensity. Further, in the withdrawn composite region 55, since the region is similarly weighted by using the dog-leg method, the maximum amplitude intensity is ⅕ of that of the apodized region 31, and further, also in each track 50 of this region 55, the elastic waves are formed so that an amplitude intensity thereof is changed in stages within the ⅕ of the amplitude intensity with the use of the withdrawal method. At this time, the region 55 is weighted by using the dog-leg method and the withdrawal method, each of which being a discrete weighting method, so that the weighting amount in the region 55 becomes slightly discrete compared to that in the aforementioned regions 31 and 54.

As seen from the above, the elastic wave generated in the input IDT 12 has an amplitude intensity in accordance with the weighting amount of each lobe shown in the aforementioned FIG. 5, and since the phase of the elastic wave is inverted between the respective lobes as described above, the elastic wave shown in FIG. 7(*b*) is excited. Note that the weighting amount in the boundary 61 is made to be zero, and thus no elastic waves are excited in the boundary 61, so that it is possible to suppress the generation of elastic waves having wavelengths that interfere with each other. Further, an oblique line in FIG. 7(*a*) is to specifically show the elastic waves which are illustrated schematically.

Further, these elastic waves are sequentially propagated toward, for instance, the output IDT 13 on the right side of FIG. 1. In the apodized composite region 54, the weighting of the finger electrodes 15 is performed not only by the apodizing method but also by the dog-leg method, so that the elastic waves are propagated while the diffraction thereof is suppressed. Further, in the withdrawn composite region 55, the aperture L in each track 50 is set to be large compared to a case in which the weighting is performed by using the apodizing method as described above, so that similarly, the elastic waves are propagated while the diffraction thereof is suppressed. Accordingly, as shown in the aforementioned FIG. 7(*a*), the elastic wave output from the right end of the input IDT 12 is propagated toward the output IDT 13 while the diffraction thereof is suppressed.

When the elastic wave reaches the output IDT 13, the electric field is formed between the finger electrodes 15, 15 in the output IDT 13, and the electrical signal having a magnitude in accordance with the electric field is received. As described above, since the distance between the places where the respective elastic waves are generated (positions of taps) and the output IDT 13, for instance, the left end of the output IDT 13 differs depending on each of the elastic waves. Accordingly, in the output IDT 13, the elastic wave generated at the right end of the input IDT 12 is first received, and thereafter, the elastic waves generated at the left side of the right end are sequentially received. Therefore, the electrical signal received in the output IDT 13 is represented by a waveform having an amplitude intensity in accordance with the elapse of time and the weighting amount of each lobe, as shown in the aforementioned FIG. 7(*b*).

Note that in the output IDT 13, a part of the elastic waves propagated from the input IDT 12 is received to be converted into the electrical signal, and the remaining elastic waves are reflected by the output IDT 13 to return to the input IDT 12. Subsequently, the elastic waves returned to the input IDT 12 are reflected by the input IDT 12 to propagate to the output IDT 13 again, a part of the propagated elastic waves is received by the output IDT 13 to be converted into the electrical signal, and the remaining elastic waves are reflected toward the input IDT 12. As above, the elastic waves are repeatedly reflected between the input IDT 12 and the output IDT 13 until all energies thereof are converted into the electrical signals in the output IDT 13 or until they are propagated to the end portion sides of the piezoelectric substrate 11 via the input IDT 12 and the output IDT 13 and absorbed by the dampers 16*a*, 16*b*. Also at this time, the elastic waves are propagated from the input IDT 12 while the diffraction thereof is similarly suppressed.

Subsequently, by performing a Fourier transform on a time response received in the output IDT 13, a frequency response shown in FIGS. 8(*a*) and 8(*b*) is obtained. Note that FIGS. 8(*a*) and 8(*b*) show a signal actually obtained by the transversal type filter of the present invention (thick line), and a characteristic obtained by a conventional point-to-point communication transversal type filter (thin line) is also additionally shown in the drawings. FIG. 8(a) shows the vicinity of the frequency pass band in FIG. 8(b) in an enlarged manner. As seen from FIG. 8(a), compared to the conventional filter, it is confirmed that the amplitude intensity is increased at both end portions of the frequency pass band, which results in improving the flatness of the frequency characteristic in the band. Further, as shown in FIG. 8(b), it is confirmed that the attenuation gradient of the amplitude intensity becomes steep at a boundary of bands, and the attenuation amount is increased at the outside of the band. Further, as shown in FIG. 9, the characteristics obtained by the filter of the present invention are confirmed to fall within the standard of the band-pass filter for the digital broadcast transmitting station.

According to the above-described embodiment, the weighting is performed on the apertures L using the apodizing method in a region in the input IDT 12 including an area in which the weighting amount of the finger electrodes 15 takes the maximum value (main lobe M) being a region that influences the intensity of the output signal. Therefore, the weighting of the finger electrodes 15 can be finely and continuously performed in the region 31, which enables to accurately design the filter so that the output signal has an intended intensity.

In addition, the apodized composite regions 54 in which the propagation region of the elastic wave is divided into the plurality of tracks 50 by using the dog-leg method and further the inside of each track 50 is weighted by using the apodizing method, are disposed on the regions adjacent to the apodized region 31. Accordingly, in the apodized composite region 54, it is possible to obtain the large aperture L compared to a case in which the weighting is performed by using only the apodizing method, so that the diffraction of the elastic wave in the region 54 can be suppressed. Further, since the region 54 is also a region that influences the intensity of the output signal, by weighting the inside of each track 50 using the apodizing method, it is possible to accurately design the filter so that the output signal has an intended intensity.

Further, the withdrawn composite regions 55 are disposed on the outside of the apodized composite regions 54, and in the region 55, the weighting methods such as the dog-leg method and the withdrawal method each of which being a discrete (discontinuous) weighting method, are applied. However, the region 55 is so distant from the main lobe M that the influence on the intensity of the output signal is quite small, and meanwhile, the influence on the flatness of the signal level and the attenuation characteristic in the frequency pass band due to the diffraction of the elastic wave is much greater than the above influence. Accordingly, in the region 55, even if the weighting amount is discrete, by obtaining the large aperture L, it is possible to suppress the diffraction of the elastic wave while minimizing an adverse effect on the intensity of the output signal. Therefore, it is possible to suppress energies of the elastic waves lost by the diffraction to a low level, resulting that the flatness of the signal level in the frequency pass band can be increased, and further, the selectivity of frequency (attenuation characteristic) can be enhanced.

Furthermore, it is possible to reduce the weighting amount while obtaining the long aperture L by increasing the number of tracks 50 in the apodized composite region 54 and by increasing the number of tracks 50 or withdrawing the position at which the finger electrodes 15 (53) are mutually crossed in the withdrawn composite region 55. Therefore, the number of side lobes S (taps) in the input IDT 12 can be increased without increasing the diffraction loss of the elastic waves, which enables to widen the frequency pass band of the filter.

Figure 21:
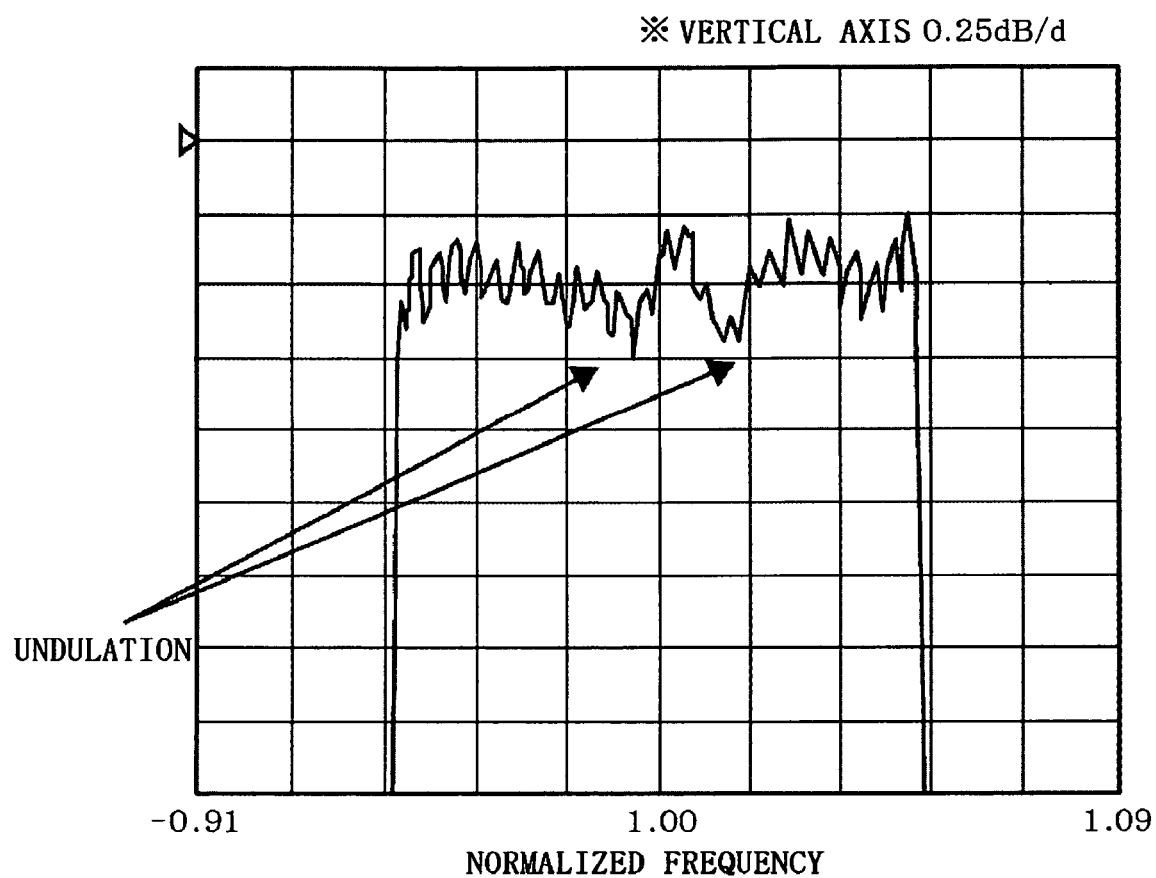
FIG. 21 is a characteristic diagram showing an example of a frequency characteristic obtained by an electrode formed by a normal dog-leg method.

Further, in the dog-leg region 51, the inside of each track 50 is further weighted using the apodizing method or the withdrawal method, so that compared to a case in which the weighting is performed by using only the dog-leg method, there is no need to increase the number of divisions of the tracks 50 from, for instance, a position approximated to the apodized region 31 to a position of an end portion of the input IDT 12. Therefore, the number of boundaries (first boundaries 61) in which the finger electrodes 15 (53) are not formed and the weighting amount is made to zero can be reduced, so that it is possible to suppress the undulation in the band shown in the aforementioned FIG. 21.

Further, when performing the weighting on the input IDT 12 as above, the weighting amount is previously set using the apodizing method, and the number of tracks 50, the aperture L and the withdrawal amount of the finger electrodes 15 (53) in the respective regions 31, 54 and 55 are adjusted so that the weighting amount of the regions corresponds to the set weighting amount, as described above. Accordingly, the continuous weighting can be performed in substantially the same manner as in the conventional apodizing method.

Figure 10:
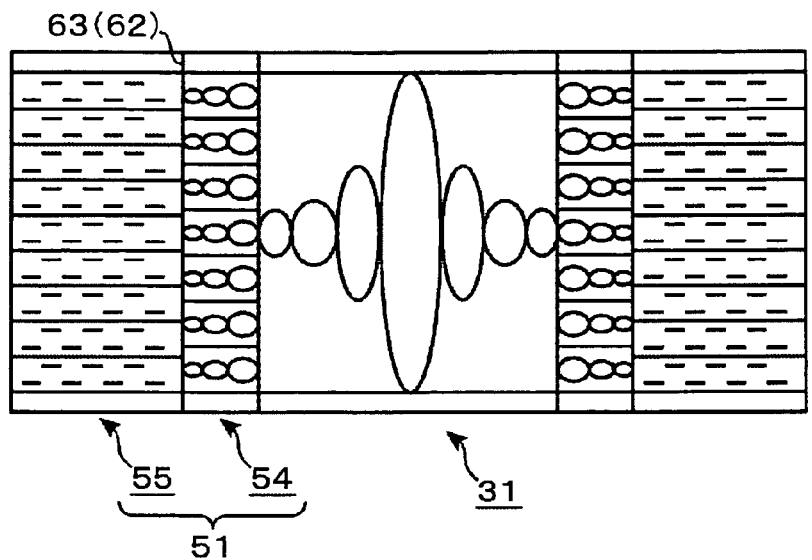
FIG. 10 is a plan view showing another configuration example of the aforementioned filter.
Figure 11:
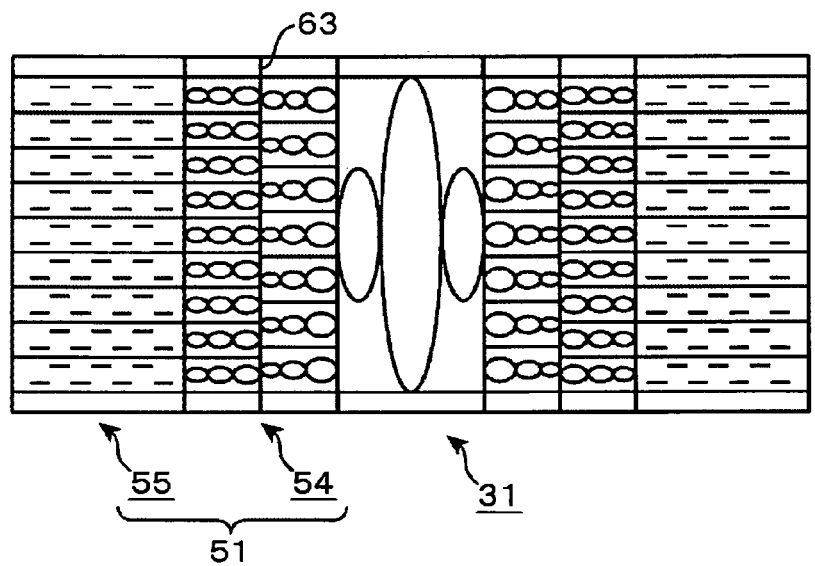
FIG. 11 is a plan view showing another configuration example of the aforementioned filter.

The number of divisions in the respective regions 54 and 55 is not limited to nine stages, and may be a plurality of stages as long as it is, for instance, two stages or more. Further, in the dog-leg region 51, each number of divisions of the apodized composite region 54 and the withdrawn composite region 55 may be changed. FIG. 10 shows an example of such a dividing method, in which the apodized composite region 54 is divided into seven stages of tracks 50, and the withdrawn composite region 55 is divided into nine stages of tracks 50. Further, as shown in FIG. 11, a plurality of divided regions may be provided in the apodized composite region 54 or in the withdrawn composite region 55. Note that when the number of divisions of the tracks 50 is changed as in the above examples, it is preferable not to provide two pieces (one tap) of finger electrodes 15 on a boundary 63 between the regions having a different number of divisions, to thereby set the weighting amount to zero.

Further, as described above, the size of each of the regions 54 and 55 (positions of the first boundary 61 and the second boundary 62 from the main lobe M) can also be appropriately changed in accordance with a desired filter characteristic. In addition, although the plurality of lobes are disposed on the apodized region 31 in the above examples, it is also possible that only the main lobe M is formed and the apodized composite regions 54 are disposed on both sides of the main lobe M.

In the above examples, the weighting is performed on the withdrawn composite region 55 by using the dog-leg method and the withdrawal method, but, the region may be formed as a withdrawn region in which the weighting is performed by using only the withdrawal method. Also in this case, it is possible to reduce the weighting amount while obtaining the large aperture L, so that it is possible to suppress the diffraction of the elastic wave and obtain the same effect as that of the above examples.

Figure 12:
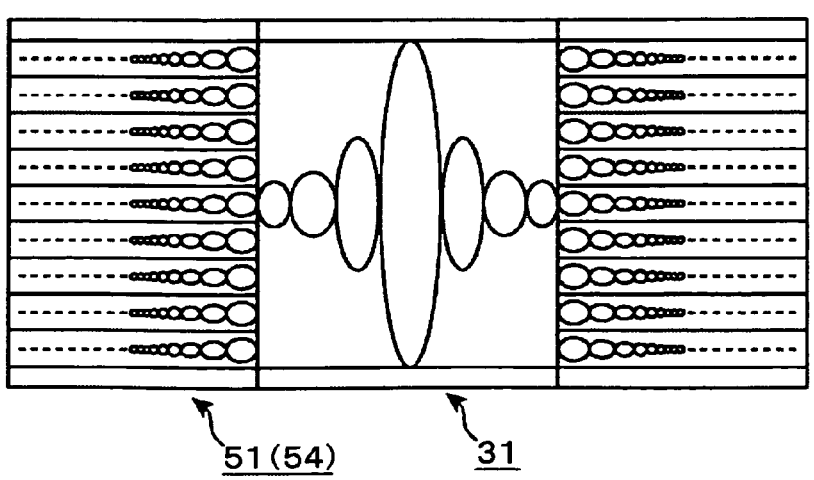
FIG. 12 is a plan view showing another configuration example of the aforementioned filter.

Further, although the dog-leg region 51 is divided into the apodized composite region 54 and the withdrawn composite region 55, the region may be formed only by the apodized composite region 54, as shown in FIG. 12. Also in this example, it is possible to obtain the large aperture L at the end portion of the input IDT 12 compared to a case in which the region 54 is weighted by using only the apodizing method, which enables to suppress the diffraction of the elastic wave.

Further, in the above examples, the input IDT 12 is disposed so as to be symmetrical around the main lobe M, but, when a filter having an unsymmetrical frequency characteristic is formed, for instance, it is possible to unsymmetrically set, for example, the number of tracks 50, the number of side lobes S and the like of the respective regions 54 and 55 around a center position of the main lobe M, as shown in FIG. 13(*a*). At this time, the weighting amount shown in the aforementioned FIG. 5 can be set so as to be symmetrical or unsymmetrical around the main lobe M.

Further, the main lobe M is disposed on a center position of the input IDT 12 and further the finger electrodes 15 are formed so that the aperture L becomes maximum at the center position of the main lobe M, but, the position of the main lobe M can be shifted in the lateral direction in the input IDT 12. Besides, the apodized region 31 is formed on the central region of the input IDT 12, but, for instance, it may be formed on substantially the center position of the input IDT 12 by being shifted in the lateral direction, or it may be formed on an end portion of the input IDT 12. Specifically, in the present invention, it is only required to form the apodized region 31 so that it includes a region in which the main lobe M having the largest weighting amount in the input IDT 12 is formed.

Further, each of the lobes M and S is designed to have the maximum aperture L at a center thereof, but, the position of the maximum aperture L may be shifted in the lateral direction. In addition, it is also possible that the dog-leg region 51 is disposed only on the right side or on the left side of the input IDT 12, as shown in FIG. 13(*b*). Also in this case, the elastic wave propagated from a region on which the dog-leg region 51 is disposed travels toward the output IDT 13 while the diffraction thereof is suppressed.

Furthermore, the respective lobes S are disposed so as to be substantially parallel to the propagation direction of the elastic wave, but, they may be disposed in the upper (lower) direction as they are distant from the main lobe M so that they form a substantially V-shape, or they may be disposed in stages from the upper (lower) side toward the lower (upper) side as they are positioned from, for instance, the left side toward the right side of the propagation direction of the elastic wave in each of the regions on the right side and on the left side of the main lobe M, so that they incline with respect to the propagation direction of the elastic wave. Besides, the present invention can also be applied to a unidirectional filter.

Further, the normal type electrode is disposed as the output IDT 13, but, the output IDT 13 may be a dog-leg type electrode or a withdrawn type electrode. In addition, it is also possible that the normal type electrode, the dog-leg type electrode or the withdrawn type electrode is disposed as the input IDT 12, and the electrode of the present invention in which the finger electrodes are weighted in a composite manner so as to suppress the diffraction of the elastic wave as in the above-described respective examples is disposed as the output IDT 13. In this case, the elastic wave generated in the input IDT 12 is first received between the finger electrodes 15 (53) and 15 (53) at the left end of the output IDT 13, and thereafter sequentially received between the finger electrodes 15 (53) and 15 (53) at the right side of the left end. Accordingly, the intensity of reception of the elastic wave is changed due to the weighting in accordance with the elapse of time, resulting that the time response which is the same as the above-described time response is obtained. Subsequently, in the output IDT 13, a part of the elastic waves propagated from the input IDT 12 is received to be converted into the electrical signal, and the remaining elastic waves are reflected toward the input IDT 12 as described above, and since the withdrawn composite region 55 is disposed on at least either of the right end and the left end of the output IDT 13, so that the elastic waves are propagated while the diffraction thereof is suppressed.

Figure 14:
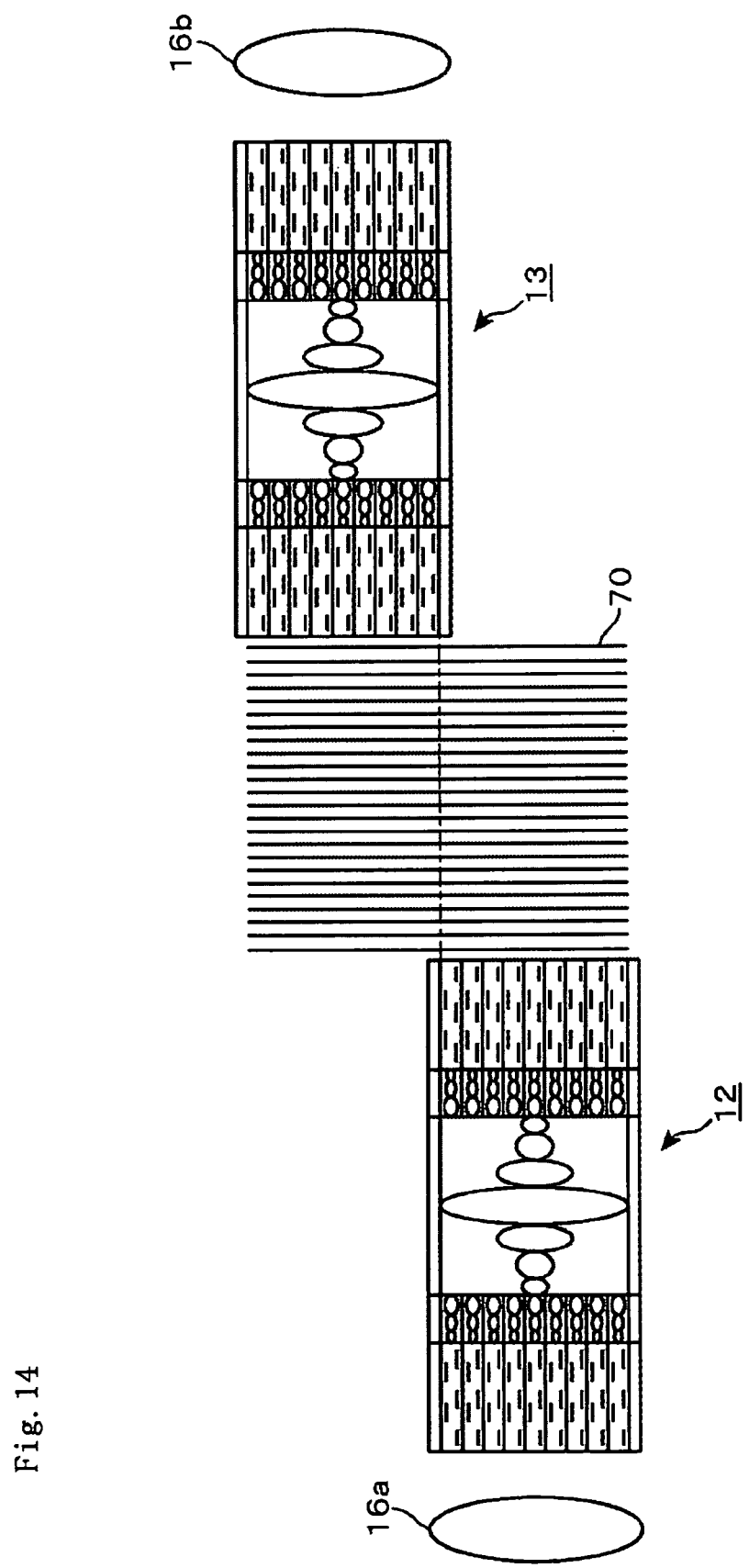
FIG. 14 is a plan view showing another configuration example of the aforementioned filter.
Figure 16:
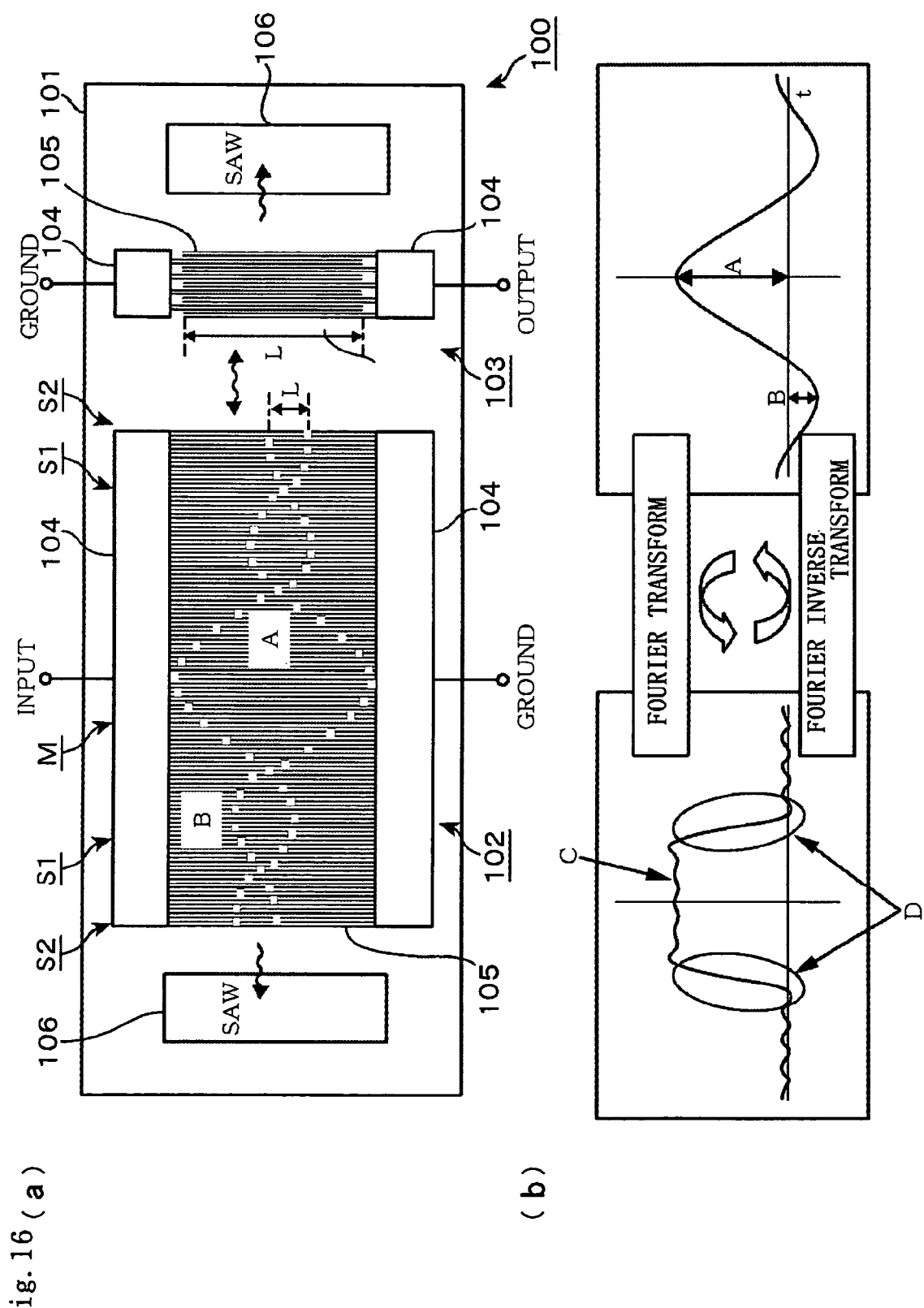
FIGS. 16(a) and 16(b) are schematic views schematically showing a principle in which an electrical signal is received in the transversal type filter.
Figure 18:
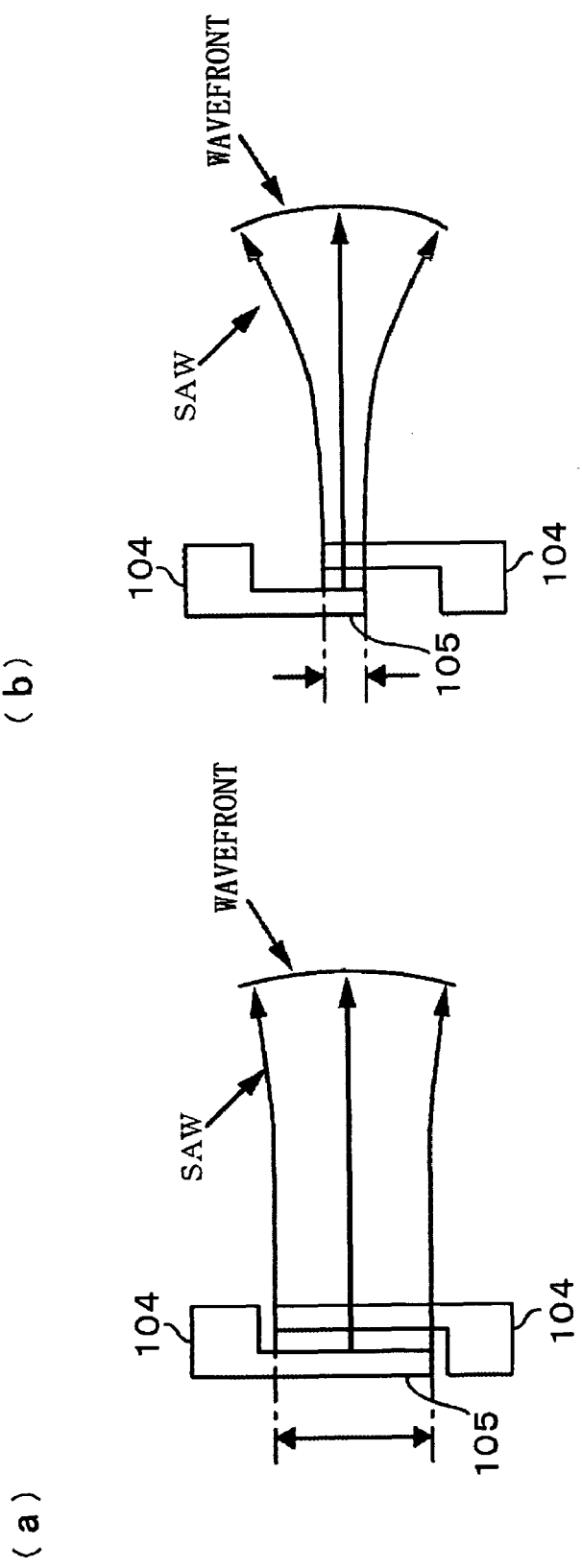
FIGS. 18(a) and 18(b) are schematic views schematically showing diffraction phenomena of the elastic wave in an electrode formed by an apodizing method.
Figure 19:
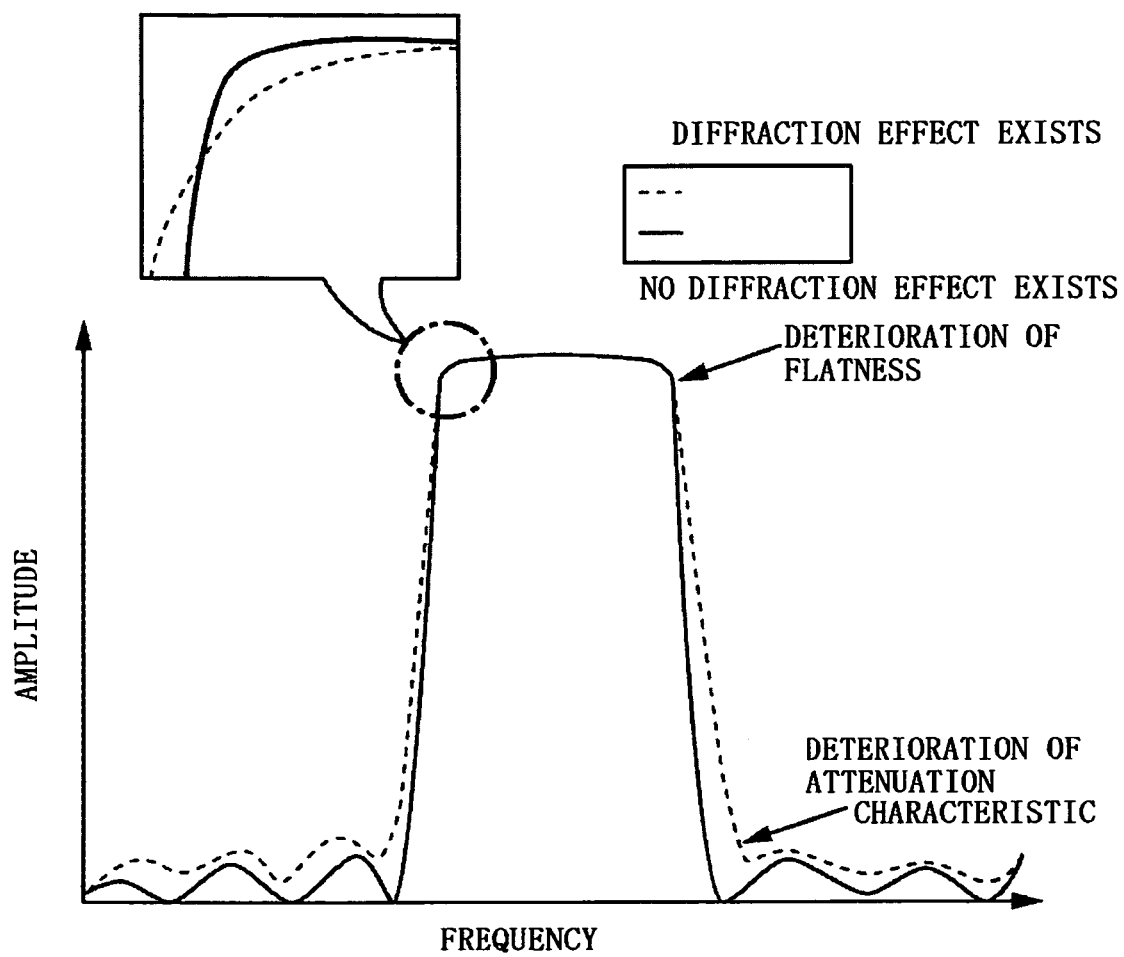
FIG. 19 is a characteristic diagram explaining a frequency characteristic which is deteriorated due to the aforementioned diffraction of the elastic wave.

Further, when the apodized type electrode or the electrode of the present invention on which the weighting is performed in a composite manner as described above is used as the input IDT and the output IDT 13, it is also possible to mutually shift the input IDT 12 and the output IDT 13 by the length of the finger electrode 15 in the vertical direction (direction orthogonal to the propagation direction of the elastic wave) and to dispose, for instance, a multistrip coupler 70 formed of a large number of long finger electrodes extending so as to cross with each other in parallel with the respective finger electrodes 15 of the input IDT 12 and the output IDT 13 between the input IDT 12 and the output IDT 13, as shown in FIG. 14, for instance.

What is claimed is:

1. A transversal type filter comprising:
   an input IDT provided with a large number of finger electrodes;
   an output IDT provided with a large number of finger electrodes to receive an elastic wave propagated from the input IDT, wherein the finger electrodes of at least either of the input IDT and the output IDT are weighted so that a magnitude of amplitude of the elastic wave excited or received between the finger electrodes is changed between the respective finger electrodes;
   an apodized region provided in at least either of the input IDT and the output IDT and in which a weighting is performed on a aperture of the finger electrodes using an apodizing method; and
   a dog-leg region provided in at least either of the input IDT and the output IDT, formed on at least either of regions adjacent to said apodized region in a propagation direction of the elastic wave, and formed by dividing a propagation region of the elastic wave into a plurality of propagation paths in parallel with the propagation direction of the elastic wave using a dog-leg method;
   wherein an apodized composite region in which the aperture of the finger electrodes is weighted by the apodizing method is formed on each of the plurality of propagation paths;
   wherein said apodized region includes at least two finger electrodes whose aperture is adjusted so that a weighting amount of the finger electrodes takes a maximum value in at least either of the input IDT and the output IDT on which the weighting is performed by the apodizing method; and
   wherein a withdrawn region in which a crossing position of the finger electrodes is withdrawn using the withdrawal method is connected to a region in said dog-leg region on the opposite side of the said apodized region.

2. The transversal type filter according to claim 1, wherein said apodized region is formed on a central region of at least either of the input IDT and the output IDT in the propagation direction of the elastic wave, and said dog-leg region is connected to at least either of an input side and an output side of the elastic wave in said apodized region.

3. The transversal type filter according to claim 2,
   wherein said apodized region includes a main lobe formed on a central region thereof in the propagation direction of the elastic wave and in which the weighting amount of the finger electrodes is gently decreased from a center toward both sides thereof, and a side lobe formed on either of regions on both sides of the main lobe and in which the weighting amount of the finger electrodes is gently decreased from a center toward both sides thereof, and wherein the weighting amount of the finger electrodes in the center of the side lobe is set to be smaller than the weighting amount of the finger electrodes in the center of the main lobe.

4. The transversal type filter according to claim 1, wherein said apodized region includes a main lobe formed on a central region thereof in the propagation direction of the elastic wave and in which the weighting amount of the finger electrodes is gently decreased from a center toward both sides thereof, and a side lobe formed on either of regions on both sides of the main lobe and in which the weighting amount of the finger electrodes is gently decreased from a center toward both sides thereof, and wherein the weighting amount of the finger electrodes in the center of the side lobe is set to be smaller than the weighting amount of the finger electrodes in the center of the main lobe.

5. The transversal type filter according to claim 1, wherein a shield electrode for suppressing coupling between the input IDT and the output IDT is provided between the input IDT and the output IDT.

6. A transversal type filter comprising:

an input IDT provided with a large number of finger electrodes;

an output IDT provided with a large number of finger electrodes to receive an elastic wave propagated from the input IDT, wherein the finger electrodes of at least either of the input IDT and the output IDT are weighted so that a magnitude of amplitude of the elastic wave excited or received between the finger electrodes is changed between the respective finger electrodes;

an apodized region provided in at least either of the input IDT and the output IDT and in which a weighting is performed on a aperture of the finger electrodes using an apodizing method; and a dog-leg region provided in at least either of the input IDT and the output IDT, formed on at least either of regions adjacent to said apodized region in a propagation direction of the elastic wave, and formed by dividing a propagation region of the elastic wave into a plurality of propagation paths in parallel with the propagation direction of the elastic wave using a dog-leg method;

wherein an apodized composite region in which the aperture of the finger electrodes is weighted by the apodizing method is formed on each of the plurality of propagation paths;

wherein said apodized region includes at least two finger electrodes whose aperture is adjusted so that a weighting amount of the finger electrodes takes a maximum value in at least either of the input IDT and the output IDT on which the weighting is performed by the apodizing method; and wherein a withdrawn composite region in which a propagation region of the elastic wave is divided into a plurality of propagation paths in parallel with the propagation direction of the elastic wave using the dog-leg method and a crossing position of the finger electrodes is withdrawn in each of the propagation paths using the withdrawal method, is connected to a region in said dog-leg region on the opposite side of said apodized region.

7. A transversal type filter comprising:

an input IDT provided with a large number of finger electrodes;

an output IDT provided with a large number of finger electrodes to receive an elastic wave propagated from the input IDT, wherein the finger electrodes of at least either of the input IDT and the output IDT are weighted so that a magnitude of amplitude of the elastic wave excited or received between the finger electrodes is changed between the respective finger electrodes;

an apodized region provided in at least either of the input IDT and the output IDT and in which a weighting is performed on a aperture of the finger electrodes using an apodizing method; and a dog-leg region provided in at least either of the input IDT and the output IDT, formed on at least either of regions adjacent to said apodized region in a propagation direction of the elastic wave, and formed by dividing a propagation region of the elastic wave into a plurality of propagation paths in parallel with the propagation direction of the elastic wave using a dog-leg method;

wherein an apodized composite region in which the aperture of the finger electrodes is weighted by the apodizing method is formed on each of the plurality of propagation paths;

wherein said apodized region includes at least two finger electrodes whose aperture is adjusted so that a weighting amount of the finger electrodes takes a maximum value in at least either of the input IDT and the output IDT on which the weighting is performed by the apodizing method; and wherein a region in which the weighting amount of the finger electrodes is zero is interposed on a boundary between said apodized region and said dog-leg region and within said dog-leg region between the apodized composite region and a withdrawn composite region in which the number of propagation paths divided by the dog-leg method is different.

* * * * *